United States Patent [19]

Waite

[11] 4,414,629

[45] Nov. 8, 1983

[54] METHOD AND APPARATUS FOR MAKING CORRELATIONS AND PREDICTIONS USING A FINITE FIELD OF DATA OF UNORGANIZED AND/OR PARTIALLY STRUCTURED ELEMENTS

[76] Inventor: John H. Waite, 46 Grove St., Haddonfield, N.J. 08033

[21] Appl. No.: 205,339

[22] Filed: Nov. 10, 1980

Related U.S. Application Data

[63] Continuation of Ser. No. 26,178, Apr. 2, 1979, abandoned.

[51] Int. Cl.$^3$ .............................................. G06F 7/00
[52] U.S. Cl. .................................................. 364/300
[58] Field of Search ................................ 364/554, 300

[56] References Cited

U.S. PATENT DOCUMENTS

| | | | |
|---|---|---|---|
| T972,003 | 7/1978 | Stinson et al. | 364/300 |
| T988,004 | 11/1979 | Nations | 364/554 |
| 3,952,184 | 4/1976 | Bassard | 364/300 X |
| 4,210,961 | 7/1980 | Whitlow et al. | 364/300 |

Primary Examiner—Edward J. Wise

[57] ABSTRACT

Kinds of data items to be examined are determined in terms of possible applicability to objects of examination and applied to objects of examination (which may be physical structures, chemical compounds, etc.) to produce a data package representative of each object in the field. The processing of the data packages may vary in accordance with a particular parameter, profile, pattern and associated properties which are being investigated. Processing may, for example, involve analyses, sorting, treeing, arranging or other types of manipulation of data packages. Preprocessing data by adding redundant data to gain symmetry and intelligence additions including procedural structures or codes for handling the data are among many possibilities enabling processing of the reconstituted data. Feedback and reprocessing of data through one or many stages, one or many times is also contemplated. The results of the procedure may enable predictions or promote correlations, such as providing preferred arrangements such as sequencing or geometrical design, identify unknowns related in some manner to the objects of examination, or enable many other possibilities for deducing information.

6 Claims, 4 Drawing Figures

METHOD AND APPARATUS FOR MAKING CORRELATIONS AND PREDICTIONS USING A FINITE FIELD OF DATA OF UNORGANIZED AND/OR PARTIALLY STRUCTURED ELEMENTS

This application is a continuation of U.S. patent application Ser. No. 26,178, filed Apr. 2, 1979, and entitled "Method and Apparatus for Making Correlations and Predictions Using A Finite Field of Data or Unorganized And/Or Partially Structured Elements" now abandoned.

I. Field of the Invention

The present invention relates to a new method or technique for structuring, handling, and processing data packages descriptive of objects under investigation, or related subject matter, some aspect of whose relationship is subject to prediction, classification, correlation, network fitting, fragmentation, or other processing.

II. Objects of the Invention

One of the aftermaths of today's technology explosion is the accumulation of very large machine readable data files. There are files accessible through language descriptors: for example, the Document Defense Center'files on government projects which produce in a day's time hard copy of everything recorded on a subject, such as "fuel cells". The three feet high computer output that is produced includes associated information which can be structured into more than 10,000 variables. To attempt to correlate any of these variables by conventional statistical methods just breaks down due to sheer size of the data resources.

This situation gives rise to a new field, recently described as "information technology," which is destined to receive more and more attention and budget allocations. Some thinkers have also recognized that formalized methodology for identifying structure in the data files must be developed. The seeds of this formalized methodology have been planted in the so-called "exploratory statistical analysis" and pattern recognition techniques. However, these systems fall far short of today's requirements to identify effects-oriented structures in the data files.

Historically new technologies usually arise to meet changing needs. Within the last decade, for instance, program languages became necessary to the profitable development of the computer business. Hence, Fortran and Cobol. Far longer ago, with the use of the trans-Atlantic cables, economics encouraged the development and protection of special cable codes. One such was Singer's copyrighted Cotton Code and another was C. H. C. Krohn's System dur die chiffrirung.

III. Summary of the Invention

The present invention, which is based on inductive methods, is intended to serve the explosion of machine-readable data. The present invention applies original thinking and concepts as well as adapting techniques from other fields in providing an integrated operational methodology. This empirico-logical methodology has been thought through and successfully experimentally applied in numerous applications, some of which are herein described.

More specifically, the invention is capable of manually or automatically and repeatedly handling data to make it easier, or even possible, to discover concealed or obscure parameters, profiles, patterns, and associated properties. Using these processing techniques, it is possible to do such things as to make predictions; to make analyses, such as breaking down gross structures (such as chemicals) into fragments and possibly restructuring them in some manner. In this respect the system is capable of helping to design chemical or pharmaceutical compounds by putting in effective fragments and by excluding useless or harmful fragments.

It is also possible to make contouring analyses to provide early warning capability for adverse effects; to reconstitute the "whole" from its fragments (e.g., mosaic fitting, network design); to determine new parameters and probability from combinations of the given ones; to determine entire or partial geometrical and topological relationships in the data for use in the above; and to do many other things;

The present invention may involve various types of additions to the available data. Data additions may be made using data already available and, in effect, adding redundancy to the data in order to achieve symmetry. This may be termed an "exploding function". Such data may be added in various ways at one time or repeatedly. After each addition the new structure may be tested by distributional analysis for merit against end goals.

In addition to data additions, there may be procedural structure intelligence additions. Intelligence additions add codes to the data which identify structural pieces, geometric positions, associated relationships, distributional priorities, ordering criteria, "transform-set" identifiers, and procedures relative to classification categories.

Prediction capabilities of the present invention may vary. Life expectancy or product failure, for example, may be applied to inanimate objects (such as compositions of matter or mechanical or electrical devices or systems), to biological specimens, including human beings, or to specific organs or systems of various biological species. The invention is also useful for simply ordering or putting into proper position, relative to fellow objects in the sample, all, or a selected portion, of the objects for a particular purpose. Thus, as will appear, the technique may be used for such various things as determining the positions in which pieces of a jigsaw puzzle are to be placed or determining the way in which mechanical parts are to be assembled or chemical compounds are to be structured or biological speciments are to arranged.

The present invention is a unique way of preprocessing and managing data sources for accomplishing a solution of defined end goals and problems. It provides the most efficient way of arriving at the optimum structure of data and methods for accomplishing a goal, such as prediction.

Much of the philosphy of the present invention and broadly some of the approaches are derived from cryptanalytic techniques. The cryptanalyst has been largely confined to problem solving, such as code breaking. However, his approach to problem solving has never been applied before to prediction work. Neither has his approach been so formalized as to create data packages in the objective sense of selection of a relatively large number of characteristics, parameters or factors to be considered and coding all data packages to show the presence of each of the parameters or factors. Many of the techniques of the cryptanalyst can be used, but the present invention is not confined to these but may use statistical or other known data handling techniques in the course of the process. It is the use of the invention directly for problem solving, particularly for prediction, which is completely surprising and unexpected. The ability of the process to make deductions that were impossible to make in the past constitutes a major advance in the art. Furthermore, the reversibility of the process (that is, its ability to deduce cause from effect or effect from cause, and its ability to proceed in small iterative processes and subprocesses whose direction is completely flexible) constitutes a completely new approach to problem solving in a scientific, systematic manner.

The present invention permits data analysis to commence at either end of a sequence or to start in the middle and progress toward either end. This can lead to major advantages and economies. For instance, in evaluating medical treatments it is conventional to trace and re-examine patients after a prescribed time interval. With the new methods of the present invention, however, current data can be worked backwards to cover the selected time span or the data can be worked both backwards and forwards from a present moment. If the study looks into the past, a study of, for example, five years' duration can be completed immediately from data already on hand. On the other hand, the time required for completion can be limited only to that portion which occurs in the future so that completion must await expiration of the predetermined data collection period.

The steps of the method of the present invention may involve multiplying data with redundant data and intelligence which defines relationship so that the resultant data packages constitute a complete finite field in an optimum ordered form. The result is that much more data is created than was present at the outset. Relevant data about the subject to be examined is determined and data packages of all such preselected data for each subject constituting the complete finite field to be examined are produced. The preselected characteristics from which the data are taken, of course, fall within a field of expertise which may vary depending upon the subject matter in a given situation. However, once the data for data packages are selected, the data packages can be coded with structured codes dependent on distribution analysis and other arranging techniques.

Prediction and correlation methods up to now have involved both statistical and/or heuristic methods, all of which have requirements, hypotheses, assumptions and specifications, which must be met. The statistical methods may include such known techniques as factor analysis, discriminant analysis, regression analysis and clustering analysis. The heuristic methods may include such techniques as treeing algorithms, combinatorial algorithms, and various pattern identification algorithms. Although theoretically possible to be performed manually, a major advantage of each of these techniques is that it enables the correlation and prediction to be accomplished by a method which may be handled by a conventional computer, together with its conventional input structure.

By preprocessing, using the present invention, the original data is changed into some form other than a conventional input. The change permits either a substantial reduction of effort and/or a new previously unattainable result. Because the method is applicable to a computer, it becomes more efficient and effective and a very powerful tool for making correlations, predictions or analyses. The computer, of course, requires a unique structuring of the data for any assemblage of the prediction methods and selects the best package of methods in the process. The reprogramming or structuring of the computer itself, together with suitable unique inputs, provides apparatus which is distinctive and highly useful. The specific hardware of the computer in a given prediction problem will be organized to produce a unique logic pattern due to structural elements such as gates, registers, memory, controls, comparison devices, and the like. Intelligence additions then enable automatic restructuring in accordance with predetermined criteria. Such a total combination device is unique and different from anything known in the prior art.

More specifically, the present invention relates to a method for structuring a finite field of data in order to make predictions therefrom. In essence, the method involves describing and coding all data in a field in terms of related characteristics. Then the data related to a particular object under investigation is collected into a data package, which contains intelligence related to similar data packages in an organized way, and which is pertinent to methods for achieving end goals, such as prediction, correlation, classification, "networking," and fragmentation. The coded data packages are organized or grouped together in accordance with their associated identifiers in accordance in various possible combinations of characteristics, including structures, topologies or patterns. The number of coded data packages which fall into each possible arrangement are counted and the counts and resulting patterns may be analysed to determine and optimize configuration (for example, for symmetry). Then, those arrangements of data packages with a predetermined pattern of recurrences are selected, and are used to determine the optimum methods and sequences to achieve the end result. Then, if appropriate, an extrapolation technique such as prediction can be made, based upon the study of these data packages.

IV. Description of the Drawing

For a better understanding of the present invention, reference is made to specific processes employing the present invention by way of example in the course of which reference will be made to the following drawings in which.

V. General Description

Figure 1:
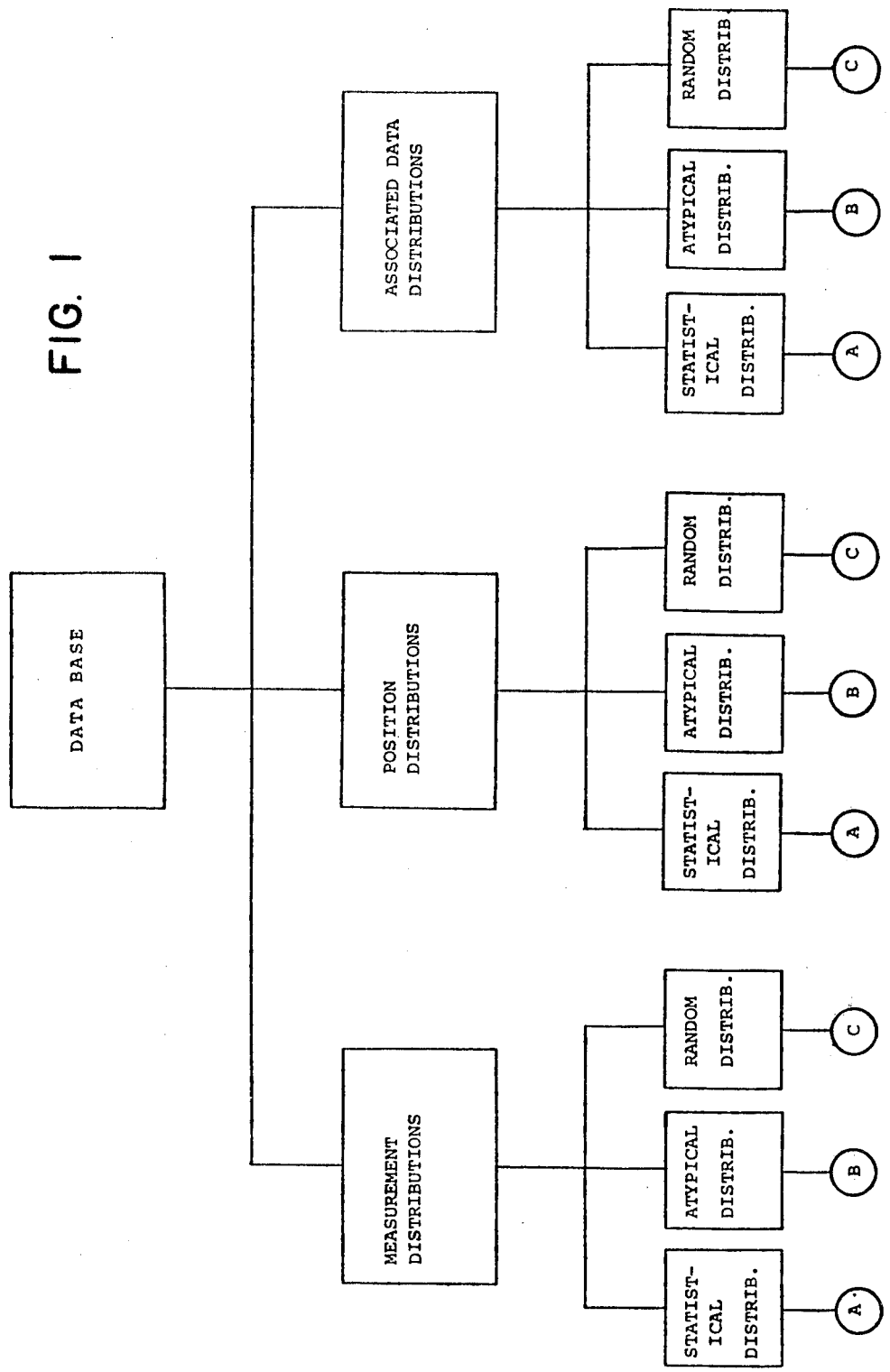
FIG. 1 is a block diagram representative of information measurement in accordance with the present invention.

The present invention, for the first time applies a cryptanalytical system approach to analysis of data, as opposed to words and language at any stage of such application. However, a statistical validation may often be applied at the end. The basic concept requires the same kind of understanding of the data as would be applied in a cryptanalyst use of codes. By marrying the disciplines of the cryptanalyst, logician and information scientist, new and powerful empirical tools in analyzing data and their structure are provided.

A basis of the cryptanalyst's approach in all code systems is substitution ciphers and transposition ciphers. The substitution technique in terms of the alphabet basically takes one letter and substitutes it for another letter for the whole alphabet. A more sophisticated technique involves using other base systems such as binary code, before the substitution. Such one-to-one systems are the simplest approach but the technique induces one to more-than-one, or more-than-one to one, or more-than-one to more-than-one.

Transposition techniques, as opposed substitution techniques, change the relative positions of data with respect to dimensions being mapped such as time, space and other desired referenced measurements. The importance of transposition as far as data is concerned, is that data itself, no matter how you pick it up has a position relative to some frame of measurement. Such a position significant approach is almost never used in a statistical approach, and by the present invention I have determined that such an approach reveals important and sometimes critical structure in the data. The statistician tends to use position only where he can use it as a transform. Another thing that a statistician can never do is the so-called "trace back" list. An empiricist must keep a log of what he undertakes with its associated data retraceable back to the original data for each step in his 'discovery' procedure. For example, it is impossible to take the mean or the standard deviation in statistics and go back to the original data from the constructs as they are used in practice. As statisticians get further and further down the tree in their analysis, it becomes more and more difficult for the statisticians to trace back to the original data causing these results. And in the end they become obliged to reach conclusions drawn from only a portion of the original data. To summarize, an empiricist uses substitution and transposition rather than transformation, and scaling. Such methods are basic to the present invention.

The rudiments of statistics are transformation, theorums, and proofs. The mathematician develops theorums or hypotheses and provide with them certain proofs, as against the cryptanalyst who establishes patterns and trace them back to the real and the coded data. In developing these theorums and proofs the mathematician takes his data and makes certain statistical constructs. This has become a very formalized discipline. The constructs that the statistician uses are without variation. Standard deviation means, as a measure of central tendency, that these are various kinds of means correlation coefficients between two variables; all of these have to be normalized, scaled, positioned. There are elegant techniques for doing scaling and positioning, such as eigen vectors, again a formal technique. In general, the mathematician is dealing in a domain of only linear tranformation. While there are some tools for doing non-linear work, they are very complex and usually are not operationally acceptable, except in such fields as pure engineering, like studying springs, torques, and bridge design and stresses. Engineering, for example, involves a distinctive mathematical use. In an important application, engineering examines failure mechanisms, like the Weibull and Ahrhenius models. In accordance with the present invention, definition of each of the techniques which is to be included employs transformations in either a cryptologist sense, or in a statistical sense, or both. Therefore, the present invention provides a new treatment for data structure in this area. Both of the disciplines are useful in accordance with the present invention, and it is necessary to consider the ramifications of the combination of both disciplines interacting with each other. The present invention is believed to involve the first attempt to get the two disciplines to interact. In particular, the present invention employs the cryptanalytic approach as an exploratory type of system in the statistical sense, and the statistical approach as a means of confirmation of results. The exploratory must precede the confirmatory, since one confirms only after he knows. As an example, in a sample of one hundred people, if a statistician is examining two variables, wherein one variable represents physical attributes and another variable represents mental attributes, he typically tabulates these qualities. After listing these in a tabular form, the statistician then tries to find the standard deviation and a mean for both variables and then attempts to correlate these. In the course of correlating, he must deal with and organize unprepared information, supply correlation coefficients, as a result of which discrimination occurs.

In setting up the table of physical attributes as one variable, and mental attributes as another variable, for a population of 100 people, for example, the statistician tries to correlate his information but quickly discovers that he has too many mixtures of the different attributes. The statistician rarely makes use of every combination but calls this nominal data, which is unusable in his solution or analysis. Many of the physical attributes, and many of the mental ones, require different measurement scales. Statistics can handle mixed measurement scales, but in a complete mixed assortment of properties under the one variable. A cryptologist has not handled such a problem in the past. But the present invention supplies a cryptanalytic technique whereby that variable is split into many others and a tree associating how these variables relate to one another is constructed with regard to both the mental and physical characteristics. The trees, in turn, develop side subsets of the major data that was collected, which then can be validity correlated with each other. Although this example of divergence of treatments is purposefully selected as a "worse case" example, it still points out the fact that, if possible variables are observed and then the most relevant are selected, the amount of divergence could be minimized.

In accordance with the present invention, when a new subject is to be explored, as in all such situations, it is very difficult to choose variables. This is because without experience, one must start from scratch in selecting variables, and take the risk that their distribution will be meaningful as analysis proceeds. Various obstacles to this process exist. For example, some of the variables, when combined, may represent a still different variable. There is a possibility of splitting a variable into various parts. Classically, the statistician has been given a problem in which the variables are cited for him, and his function is to classify and group the variables to make them more useful to determine how valuable they are. Normally, it is not within the statistician's responsibility to find out whether those variables are correctly chosen. Rather it is left to him to confirm what information those variables contain to meet some end-goal requirement. In such limitations on the statisticians, the empiricist is better prepared to handle many problems. Because of the nature of his data source, the cryptanalyst cannot assume any knowledge whatever about the data. Therefore he is obliged to gain information in a search for the identification of variables or fragments of variables and then put them together. In accordance with the present invention, cryptanalytic techniques have been employed to gain the information, look for symmetry, look for combinations, look for effects of variables in patterns which are actually preliminary effects, not end effects, look for splitting variables, and look for positional worthiness. This kind of gaming of the input is absolutely impractical and, because of the methods chosen, is not permissible in normal statistical data handling.

VI. Identification of Information Structure

The government has been saying more and more that they have more data than they know what to do with and they request that data submission be reduced. The fact is that we have not been using the full capability of our data resources because of the lack of knowledge about how to measure information. The role of statistical criteria is far too limiting. Shannon's theory of information is too much oriented to communications theory. What is needed is a whole new methodology for measuring and preparing information from given file resources. The cryptanalyst has the best foundation to accomplish the job; however, his mission and data resources are too restrictive.

Consider the following types of files:

A. A set of dictionaries in French, German, and English etc. What uniquely identifies them without knowledge of the language? One property would be the relative frequency of two continuous letters in words. For example, th or qu in English; ch or ze in German; ez or ay in French. Far better, however, if the words make linquistic sense, is the ratio of duplicate letter pairs to total letter pairs when a text is folded against itself in every position. These are invariant properties of inherent structure if enough data is available.

B. Data on battery failures in accelerated life testing. After all the batteries which failed have been torn apart and the component changes from good cells are noted and coded, certain things will have been listed. For example, short circuits through the plates, leaking seals, damaged separators, dried out cells, high pressure in cells etc. When the manufacturing processes are included with the manufacturer and the test regimes, then combinations of the information will reveal invariant and persistant appearance of certain mechanisms of failure. Again, these are properties of structure in the data which reveal where to look for scientific explanation.

C. Cell changes in cancer of the cervix. Pap smears data can be taken and organized into levels of impending disease. The changes and distributions of these cells can be used to classify the level of disease. Already known is that displasia is a forerunner of cancer. Not known but determinable by this invention is the fact that the proliferation of parabasel cells increases at an exponential rate earlier than displasia. Again, this effect is inherent in the structure of these data.

Many other samples can be cited. From many years of development it has become evident that we can describe or define inherent information structure and how to find it. In general, it may be classified into these types:

1. Low grade structures—These include simple linear relationships, normal distributions, well-behaved non-linear relationships and in general, distributions and relationships that standard mathematical procedures or pattern recognition techniques quickly recognizes. When this situation is recognized by our methods, the system transfers to those procedures by indicating that the structures are conventional.

2. Medium grade structures—These include relationships that do not rise and stabilize until combinatorial mappings have been done, or other methods have been applied, such as, change of base, or reclassification and/or coding of the data. Normally such mappings are not accomplished by conventional methods except, in part, by step-wise regression for example. In this case, the method of the present invention will provide an option to transfer to conventional methods where their feasibility is indicated.

3. High grade structures—These include relationships that appear generally random, and only after very sophisticated methods have been applied, reveal inherent structures which are not random, even if limited to only sub classes of the files. The method of the present invention is the only systematic way of reaching supported conclusions.

VII. The Necessity for Organization and Reorganization of Data Files

In order to discover inherent structures in the data files, it is often necessary to reorganize them so that one can focus upon clues which can be expanded once a little knowledge has been obtained. To reorganize the files, methods of procedures must be designed in such a way, that results from each method applied will reveal another method for further organization. The methods fall into the following general catagories:

A. Classificatory Methods—These methods isolate parts of the file and their associate factors which essentially reveal a change in the file distribution mappings from a relatively random distribution toward non-random distribution direction.

B. Combinatorial Methods—These methods search for combinations of factors which change the distributional mappings of the combined elements with respect to all the other combined arrays.

C. Ordering Methods—These methods search for positional relationships which affect the distributional mappings of any portion of the data file. The position can be a function of the time dimension, the space dimension or any other imposed ordered dimension.

D. Correlation Methods—These methods relate one class of data and determine the commonalities.

E. Data Explosion Methods—These methods generate synthetic or redundant information for the purpose of identifying symmetry in the information from only partial or incomplete evidence. By using negative indicators, data reduction methods are accomplished by the same methods.

F. Boolean Methods—These methods include 'and' and 'or' conditions in addition to 'and-not' and 'or-not' conditions.

In addition, other methods involving transforms and assigned codes can be generated in order to find an initial starting point in analyzing data structure determinations.

These methods are used to organize and reorganize the file or parts of the file which are, in turn, then tested by the distribution mappings and, depending upon the results, are rescheduled for further organization until all aspects are exhausted or until acceptable results are obtained for statistical and scientific evaluation.

In the past there have been some techniques to help recognize patterns. In general, adaptive recognition systems have been called "Perceptrons", after the original Rosenblatt Perceptron. These systems have been used to "recognize and classify" patterns. The perceptron approach constitutes a deductive process for pattern recognition. The perceptron approach, for example, employs the following techniques:
1. A training set.
2. Identified class.
3. Associated methods which discriminate class in training.
4. New items to be classified into identified classes.
5. The percent of success probabilities.

The method of the present invention differs in that it is an inductive process for recognition of the information content in masses of data. In contrast to the "Perceptrons," the present invention includes the following distinctions:
1. A training set is not required.
2. Data set classes (if any) can be unknown.
3. Methods to produce distributional mappings are ordered by significance of their own meaning (i.e.,-statistical or empirical).
4. Methods are provided to re-organize data and iterate through previous precedures, repeating processes as often as new data or reorganized data is available for the purpose.
5. Classes within the data are identified and used.
6. Methods to produce the solution of the problem may be derived from the data.

The following descriptions of several data files and the problems associated with them have been successfully resolved by the method of the present invention.

VIII. Toxic Data Base

Every year, thousands of new chemical compounds are developed and marketed by industry. The degree of toxicity of these compounds is unknown and, by federal law (the Toxic Substances Control Act), must be assayed. A problem arises because the laboratory testing of a single compound can cost in excess of $100,000.00 and can require up to two years. It is apparent that the laboratory testing of all of each years new crop of chemical compounds is impossible because of cost and time contraints.

What is required, then, is a capability to predict the potential toxicity of an unknown compound on the basis of information other than physical testing.

In order to develop such a predictive capability, a data base of approximately 700 compounds of known acute toxicity was acquired. The technique of application of the method of the invention to this development was to analyze certain representative physical and chemical properties of the compounds and then associate those properties with known toxic levels. An assumption was made that the acute toxicity of an unknown compound could be predicted by comparing its properties to the known properties and associations of the compounds in the toxic data base. This procedure, then, would constitute a screening process to select the most likely compounds as candidates for laboratory testing.

The 700 compound toxic data base was analyzed and classified or grouped into the following parameters:
1. Compound identification.
2. Molecular Formula.
3. Molecular weight.
4. Effects measurements.
5. Physical constants.
6. Chemical substructure fragment codes.

These parameters were assembled into a data file and processed through procedures described hereafter. The processing resulted in a system which had the capability to predict acute toxicity with a good degree of reliability.

The processing included the following sequence of methods:
1. The chemical compound was identified by 5 reference codes. The chemical abstract number (CAS) the Merck number (9th edition), the Registry of Toxic Effects Number (RTECS), the Mutagen Compound Number (EMIC), the Teratogen Number (ETIC). This was done to permit the retrieval of effects from any cross reference files.
2. The compound was identified by its molecular formula. This was done to permit the retrieval of chemical analogues.
3. The compound was identified by molecular weight. This is an important property that is always available.
4. The effects listings from any source was listed by route, species and acute or chronic toxic levels.
5. Physical Constants including any occurrance of an associated physical properties (above a stated threshold) such as, solubility constance, dipole moment, specific density, melting point and 110 others.
6. The moieties or chemical fragments of each compound was listed from atom center fragment, TSS fragment keys, and/or CDS fragment keys as chemical properties of the compound.

All of the above data were coded into alpha-numeric codes in order to apply the methods of the patent to obtain Boolean, combinatorial, time or space series distribution mappings essential to measuring the information content of the data of application. The distributional analysis above identified those parameters or combinations of parameters which should be correlated against effects. Where correlations were significant (i.e., above a set threshold). These parameters were selected for the prediction model.

IX. NASA NiCd Spacecraft Battery Failure File

Given a data file of information (regarding NiCd spacecraft battery failures) that was developed as a historical record of events; how does one determine if information that will lead to a predictive capability is contained with the file? The predictive capability, if possible, must non-destructively and reliably function with data from not more than 1% of the predicted lifespan of the batteries.

The file consists of English language post-mortem autopsy results on nickel-cadmium spacecraft battery cells. The cells are identified by the following parameters:
1. Manufacturer.
2. Orbit regime (length of charge/discharge cycle).
3. Ambient temperature in test chamber.
4. Depth of discharge.
5. Discharge rate (in amperes).
6. Percent of recharge.
7. Recharge rate (in amperes).
8. Number of charge/discharge cycles attained prior to failure.
9. Catastrophic or parametric failure (for example, did the cell explode or did the output voltage fall below a threshold).
10. Voltage and current measurements.

In addition to the above identifiers, each cell, following failure and autopsy, is described by the characteristics of failure observed by the operating technicians and battery specialists. These descriptions are ambiguous in some cases as are the descriptions of an event given by several bystanders.

An initial analysis of the descriptions of failure indicated that a structure of 21 codes would encompass them all and eliminate virtually all of the ambiguity that resulted from language descriptors. The identifiers cited above were associated with 21 coded characteristics (or descriptions) of failure in a new data base that was amenable to computer processing for derivation of information concerning NiCd cell failure as associated with both operational and manufacturing parameters.

The 21 failure characteristics are listed in Table I, below.

The Associated operational data are listed in Table II, below, in which "pack" refers to the battery pack in which the cells were located. The number next to the pack number identifies the manufacturer of the battery, and the letters under the cell numbers identify the failure modes for each cell, in accordance with Table I.

By methods of the patent, combinatorial frequency distributions were obtained as in Table VIII below, with "and" and/or "not" conditions. The major failure mode was identified as ABCP, the meaning of which is explained in Table I. In addition, all other failure modes were identified and listed in order of their frequency of occurrence.

TABLE I
FAILURE CHARACTERISTICS

| | |
|---|---|
| A. | Low Voltage charge. |
| B. | Low Voltage Discharge. |
| C. | Separator: Deteriorated, Dissolved, Burned, Pinpoint Penetration, Short. |
| D. | Plate Material Shorted Through Separator. |
| E. | Separator Impregnated With Negative Plate Material. |
| F. | Migration of Positive and/or Negative Plate Material. |
| G. | Extraneous Material Between Plates. |

TABLE I-continued
FAILURE CHARACTERISTICS

| | |
|---|---|
| H. | Deposit on Positive and/or Negative Terminals. |
| I. | Blistering on Positive Plate(s). |
| J. | Plate(s) Stuck To Case. |
| K. | Excess Scoring of Case. |
| L. | High Pressure, Bulge, Convex Side(s) |
| M. | Concave Side(s), Shorts(s) Due To Internal Shift. |
| N. | Broken Seal(s): Ceramic, Glass |
| O. | Ceramic Short |
| P. | Electrolyte Leak, Weight Loss, Separator Dry, Electrolyte Shorted Out Cell. |
| Q. | Tab(s): Burned, Broken, Welds Weak. |
| R. | Third Electrode Shorted to Plate. |
| S. | Cell Blew Up. |
| T. | Circuit: Short, Open. |
| U. | High Voltage Charge. |

TABLE II
CELL FAILURE CHARACTERISTICS

| PACK | | 1 | 2 | 3 | 4 | 5 | 6 | 7 | 8 |
|---|---|---|---|---|---|---|---|---|---|
| 1 | 2 | BUQKT | | BQKFC | BUCP | BHKFC | BTKFC | | |
| 2 | 2 | BLKFC | ABKDQC | | | BPLCD | BEFCQL | ABDQKCE | |
| 3 | 4 | | ABPQ | | BCEI | BUTGD | BPCD | BPCD | |
| 4 | 4 | ABCL | | AC | | | ABPE | BPL | ABPL |
| 5 | 2 | | BUKFTC | BLQTKFC | | | | | |
| 6 | 2 | | | | DTQ | | BQKFC | BKTQC | BE |
| 7 | 4 | APNCFQ | APEFCQ | APQC | | TPQEC | ABPCEQ | APFC | |
| 8 | 4 | ACE | ABPCEQ | | | | ABPE | ABPQCE | APQ |
| 11 | 3 | THFIC | BUHFICR | ROICP | | | | | |
| 13 | 3 | BUPL | ABOCEIL | | ABOIC | ABOI | | ABOI | |
| 14 | 3 | BUPL | BUD | ABO | BUPL | PMLN | | BO | |
| 15 | 1 | | | | BFCI | BHFIC | | ABIFC | ABIFC |
| 16 | 1 | BDCET | | | ABEC | ABEC | BCDT | BQ | |
| 17 | 3 | ABOL | ABCIL | BULO | | BUO | | | |
| 18 | 3 | ABOIE | | BPL | | ABOI | BPMO | BULO | |
| 25 | 2 | ABKFC | ABFCQ | BCD | BLTKFC | AUCKT | BTCG | | |
| 26 | 2 | D | | TK | ABCD | | BLQD | BLQKC | |
| 27 | 4 | | ACE | ABPCF | | | | ALDF | APDCF |
| 28 | 4 | ABTD | APQ | BUQ | ABTIE | BUP | ABDQ | APL | APL |
| 29 | 2 | TQDK | | | | BHQKFC | BHPQKDC | ABCQ | BCK |
| 30 | 2 | TC | | | ABCQK | | | CT | ABPTKFC |
| 31 | 4 | ABPGCO | BUDC | ABPDCEQ | | | ABDGECQ | | BUPCEQ |
| 32 | 4 | BPT | | BP | ABPT | | BQH | PTL | |
| 33 | 5 | P | P | P | P | | | | P |
| 37 | 3 | | | ABPO | ABOI | | BUCEIO | BOPIC | ABPO |
| 38 | 3 | | ABLO | BUP | | BT | ABPO | | ABO |
| 39 | 1 | BHQFC | BPTQUC | | | BPQFC | BTPQUC | BQU | BC |
| 40 | 1 | | BUPQT | BUTQC | | BUQ | BUPTCQ | BUTCQ | BPF |
| 41 | 3 | | BO | BOI | | | BO | BOI | BO |
| 42 | 3 | ABLOP | | | ABPIFCO | | BPC | ABO | BO |
| 43 | 1 | | | BUTCQ | BTCQA | | Q | QTC | |
| 44 | 1 | THC | BUHFCI | BFC | | | Q | | BUCI |
| 50 | 2 | | | ABHKFT | | ABDKF | | | |
| 52 | 4 | | | TGDFC | | | | BUFCE | ABLEFC |
| 57 | 5 | P | P | P | P | P | P | P | P |
| 66 | 3 | | | BOLMIP | BHLMTOF | BULHNIC | BULMNP | ABPEILM | ABMO |

X. The RTECS File

The Registry of Toxic Effects of Chemical Substance (RTECS) file is sponsored by the United States Department of Health, Education, and Welfare. The file contains information on some 33,000 identified chemical compounds consisting of drugs, food additives, preservatives, ores, pesticides, dyes, detergents, lubricants, soaps, plastics, industrial chemical intermediates, etc.

The information per compound in this file consists of one or more of the following catagories:
1. Compound identification numbers.
2. Compound chemical name(s).
3. Trade names and synonyms.
4. Molecular weight and formula.
5. Animal test species (more than 25).
6. Toxic dose measurements (more than 6 types and more than 10 units-of-measure).
7. Routes of administration (more than 20).
8. Literature references.

9. Effects (more than 20 types).
10. Regulatory agency citations.
11. Bibliographic references.

This file has been developed at considerable expenditure of time and money and constitutes probably the largest and most authoritative source of tested effects of chemical compounds.

Since testing all chemical compounds in animals for acute or chronic toxicity is prohibitive in cost and time requirements, some method for estimating toxicity of compounds was necessary. By utilizing all the available effects data and associating this effects data to all compounds in specific chemical classes, which classes are identified by common physical and/or chemical properties or combination of properties as discovered by the methods of this invention, certain reliable estimates were identified (reliable as determined by chemical review and selected animal tests). Where estimates were not possible, the distributional analyses revealed the cause of the inability to estimate which was either too sparse a background of analogues or too broad a class as identified by properties for the isolation of a common effect.

Chart 1, illustrates an ordered (by two dimensions) array of a class of chemicals all identified by a common end effect, i.e., cholinesterase inhibition, and related to route and species animal test effects data with human effects data. The chart illustrates that the route and species are not all equally representative of tested effects on humans.

CHART I

ROUTE/SPECIES ORDERED EFFECTS BY CLASS (CHOLINESTERASE INHIBITORS)

| CLASS WINDOWS | SCU-GPG | SCU-RBT | IVN-RAT | IVN-DOG | IVN-CAT | IMS-RAT | ORL-DCK | IVN-RBT | ORL-BDW | SCU-RAT | SCU-MUS |
|---|---|---|---|---|---|---|---|---|---|---|---|
| 0.038–1.00 | B | B | B | B | B | B | P | B | P | B | AB K |
| 1.10–2.27 | | | | | | | | | CH JL N | | C |
| 2.28–3.00 | | | | | | | L | | | | |
| 3.10–4.00 | | | | | | | | | FQ | | |
| 4.10–4.60 | | | | | | | | | | | |
| 4.70–6.00 | | | | | | | | | U | | |
| 6.10–8.50 | | | | | | | | I | R | | |
| 8.60–9.50 | | | | | | | | | | | |
| 9.60–11.50 | | | | | | | | | I | | |
| 11.60–14.00 | | | | | | | | | T | T | |
| 14.10–36.00 | | | | | | | | | S | | MO RS |
| 36.10–68.00 | | | | | | | | | W | O | L |
| 68.10–82.00 | | | | | | | | | | | |
| 82.10–97.00 | | | | | | | | | | | |
| 97.10–112.00 | | | | | | | | | | | |
| 112.10–121.00 | | | | | | | | | | | |
| 121.10–144.00 | | | | | | | | | | | |
| 144.10–175.00 | | | | | | | | | | | |
| 144.10–175.00 | | | | | | | | | | | |
| 144.10–175.00 | | | | | | | | | | | |
| 175.10–250.00 | | | | | | | | | | | |
| 250.10–455.00 | | | | | | | | | | | |
| 455.10–555.00 | | | | | | | | | | | |
| 555.10–775.00 | | | | | | | | | | | |
| 775.10+ | | | | | | | | | | | |

| CLASS WINDOWS | IVN-MUS | IPR-RAT | IPR-MUS | ORL-RAT | SKN-RBT | SKN-MUS | SKN-BDW | ORL-CKN | ORL-MUS | SKN-RAT | ORL-PGN |
|---|---|---|---|---|---|---|---|---|---|---|---|
| 0.038–1.00 | AK | B | BC V | BC | B | | | | | | |
| 1.10–2.27 | | L | | HL | | B | L | G | IP | C H | |
| 2.28–3.00 | | | | | | | | | | | |
| 3.10–4.00 | | R | | D | | | | | | | L |
| 4.10–4.60 | O | | | | | | | | E | | |
| 4.70–6.00 | | F | | IP V | C | | | | | | |
| 6.10–8.50 | | Q | F | | F | | Q | P | CK L | L | |
| 8.60–9.50 | IR | | R | R | | | | JN | | | |
| 9.60–11.50 | | U | I | U | | | | | H | | |
| 11.60–14.00 | | | | G | | | | Q | | | |
| 14.10–36.00 | L | M | TU | MN Q | | | | T | QR | U | |
| 36.10–68.00 | S | | | JK T | L | | | U | | R | |
| 68.10–82.00 | | | O | O | T | | | | | | |
| 82.10–97.00 | | | | | | | | | O | | |
| 97.10–112.00 | | | | | T | | P | O | M | | |
| 112.10–121.00 | | | | | | | | | | P | |
| 121.10–144.00 | | | | | | | | | T | N | |
| 144.10–175.00 | | | | | | | | | | | |
| 144.10–175.00 | | | | | | | | | | | |
| 144.10–175.00 | | | | | | | | | | | |
| 175.10–250.00 | | W | QR | | | | | | U | Q | |

CHART I-continued
ROUTE/SPECIES ORDERED EFFECTS BY CLASS
(CHOLINESTERASE INHIBITORS)

| CLASS WINDOWS | ORL-OAL | ORL-HMN | SKN-HMN | IPR-GPG | SKN-GPG | ORL-GPG | ORL-RBT | ORL-DOG | IVN-GPG | ORL-CAT | IPR-CKN |
|---|---|---|---|---|---|---|---|---|---|---|---|
| 250.10–455.00 | | | | | | NO R | | | | M | |
| 455.10–555.00 | | W | W | | | | | X | | | |
| 555.10–775.00 | | | | | | | | | W | | |
| 775.10+ | | | | XY | PU | | | | V | Q | |
| 0.038–1.00 | | | | | | | | | | | |
| 1.10–2.27 | | | | | | | | | | | |
| 2.28–3.00 | | | | | | | | | | | |
| 3.10–4.00 | | | | | | | | | | | |
| 4.10–4.60 | | | | | | | | | | | |
| 4.70–6.00 | | | | | | | | | | | |
| 6.10–8.50 | L | | | | | | | | | | |
| 8.60–9.50 | | | | | | | | | | | |
| 9.60–11.50 | | P | | | | | | | | | |
| 11.60–14.00 | | | | | | | | | | | |
| 14.10–36.00 | | | B | M | H | H | I | P | | | |
| 36.10–68.00 | | | | | | Q | | | R | | |
| 68.10–82.00 | | | | | | | Q | | | | |
| 82.10–97.00 | | | | | | | | | | | |
| 97.10–112.00 | | | | | | | | | | | |
| 112.10–121.00 | | | | | | | | | | | |
| 121.10–144.00 | | | | Q | | | | | | | |
| 144.10–175.00 | | | | | | | | | | | |
| 144.10–175.00 | | | | | | | | | | | |
| 144.10–175.00 | | | | | | | | | | | |
| 175.10–250.00 | | | | | | | | | | | |
| 250.10–455.00 | | | | W | | | | | | S | |
| 455.10–555.00 | | | | | | | | | | | |
| 555.10–775.00 | | | | | L | | | | | | |
| 775.10+ | | | | | | R | W | T | | | Y |

| | RTECS NO. | AVG. LD$_{50}$ | | RTECS NO. | AVG. LD$_{50}$ |
|---|---|---|---|---|---|
| A | TA87500 | 0.10 | N | TC28000 | 84.00 |
| B | TA84000 | 2.26 | O | GQ50750 | 111.06 |
| C | UX68250 | 2.30 | **P | FB94500 | 114.91 |
| D | TC65500 | 3.70 | Q | GN63000 | 128.50 |
| E | TJ21000 | 4.50 | R | TG01750 | 160.60 |
| *F | TD92750 | 4.87 | S | GY38700 | 167.25 |
| G | GN59500 | 7.10 | T | TC03500 | 168.78 |
| H | TD94500 | 9.27 | U | TD52500 | 203.25 |
| I | UX59500 | 10.30 | V | TF05250 | 288.50 |
| J | LZ94500 | 13.67 | W | TA07000 | 497.14 |
| K | BR31500 | 14.65 | X | TD56000 | 688.50 |
| L | TF45500 | 55.30 | Y | GN52500 | 848.00 |
| M | GN75250 | 80.50 | | | |

*5500 mg/kg (OUTLIER)
*10,000 mg/kg (OUTLIER)

XI. Western Electric Warehouse Inventory

The Western Electric Company has, through mergers and acquisitions, developed a system of 36 large stock warehouses throughout the country. Each of these warehouses carries both stock that is unique to its location and stock that is used throughout the entire system. The problem is that each warehouse has an indigenous and unique stock numbering scheme and Western Electric, for reasons of economy and efficiency, desires to have a systemwide stock numbering scheme. Because of the very large number of stock items carried in the system, the desired numbering scheme must be automatically imposed by data processing methods.

The stock records in each warehouse were in punched card form; one card per item. The only possible area of commonality among the punched cards from each warehouse was a 25-character alphanumeric descriptor phrase in each card. For the most part, the descriptor phrases among the warehouses differed in spelling, format, and abbreviations. Our problem was to measure the information content of the descriptor phrases through various types of distributions, develop and apply certain rules so that the descriptor phrases could be coded, and develop a logic that would enable a computer to manipulate the codes and automatically determine commonality between differing phrases that described the same object. Following the automated commonality determination, systemwide stock numbers were easily applied. This problem was solved with techniques explained herein after in Sections XXI through XXIII, and hereafter as illustrated in Table XIV.

XII. Description of Fundamental Methods

As discussed above, no means for unravelling the structure of large masses of information for the purpose of establishing cause and effect relationships has been available. Statistical treatment, such as discriminant analysis, linear regression or analysis of variance, do not provide adequate description of the data structure since internal relationship of the information is neglected. An approach has been needed which provides a formalized system of procedure or method which reveal both the content and distribution of all relevant information.

To handle modern day problems dealing with tens of thousands of variables, complex interacting environments and large, incomplete, unorganized and imprecise data test-sets, a need for new methodolgy or system of methods for treatment of the data is essential. The present invention relates to such a system of novel methods which has been successfully tried experimentally on many applications in industry and science. The purpose of this invention is to make possible identification of dominating and persistant features, aspects and associations in the data test-sets which serve as a basis to determine cause and effect relationships and which can be confirmed by statistical methods.

Known mathematical treatment of such data breaks down because there exist no control over such data, and it is too voluminous even for computers to organize without involving some innovative and new methodologies, so that non-random hypotheses can be made.

The new system of methodologies includes many novel features for structuring data. These features can be formally combined by using feedback from previous results to broaden the knowledge of intrinsic data structures.

The system described in this invention contains many properties that distinguish it from the conventional analytical methods that rely on statistical and mathematical bases. It can be described earlier, go backwards, forward, or in both directions at the same time.

More precisely, its distinctiveness comes from the fact that the system is empirical in nature, and in the following examples, among others, empiricism excels:

The empirical system in this invention can handle up to one million variables. Conventional analyses are far more limited.

The invention treats critical relationships not as functional but as logical relationships.

In empirical work interactions identify themselves through associations. They cannot, accordingly, be wrongly assumed to be independent variables.

The system can identify and use negatives that are important to the analytic work.

Empiricism derives causal relationships from the bottom up. But when modern problems prove not to be functional, as often is so, it is easy in using formal statistics to confuse effects with causes.

The system does not rely on averaging and maintains its data base throughout.

In the system discrimination by classes and combinatorials comes entirely from logic.

The system, being empirical, allows the data to design the method and model needed to complete the analysis. Nothing is stipulated a priori.

Active elements can be easily isolated with respect to background in the system.

The empiricism that drives the system has a fail-safe quality. Used properly the system can correct its own errors and identify omissions that may be consequential.

The flexibility of the system permits an open end design in which new parameters, new associations, and new environments are developed.

Six major methods form the fundamental basis of the system from which modifications and combinations from feedback serve to establish a continually expanding 'road map' for instructing the system what to do next. The six major methods are:
A. Distributional Mappings
  1. On parameters or features.
  2. On order relationships.
  3. On associations between parameters.
B. Correlation Mappings
  1. Linear.
  2. Planar.
  3. Global.

The present invention employs procedures which involve the creating of distributional tables with respect to value levels, positional structures and interrelated associations. The system of methods is unique and provides insight into the structures of massive amounts of data, the handling of which has hitherto been impossible. The following table incorporates information broadly describing the general types of method involved:

TABLE III

| TYPES OF DISTRIBUTIONS | | |
|---|---|---|
| VALUE (1 Data Set) Mappings n-grams | POSITIONAL (1 Data Set) Mappings Antecedence Consequence | ASSOCIATIONAL (Multi-Data Set) Mappings I/c Property |
| CONDITIONAL VALUE Boolean Bigram | CONDITIONAL POSITIONAL Content Dependent X ... Y | CONDITIONAL ASSOCIATIONAL (Data Dependent Indexing) |

Examples of these distribution types are described hereafter. Since the procedures selected depend upon information presented initially and the results from each method applied thereafter, rules of interpretation for selecting the correct sequence of methods can be developed in each application. Such development of specific rules may require the participation of a knowledgeable scientist in the particular field of application.

Basically, the method of the present invention involves a complex assortment of data distribution mappings, which, in turn, is repeated after the application of data reorganization methods until desired results are obtained. As shown in FIG. 1, mappings are performed on three distinct types of data:
1. Measurement data.
2. Position data.
3. Associations between both measurement data and position data. These distributions or mapping take form at various levels of complexity. The first level consists of simple frequency distribution tables which list the frequency of occurrance of each measurement level. For example, at a given dose expressed in mg/kg, how many compounds were there out of 33,000 which had 100 mg/kg for one lethal does given orally to a rat?.

Where measure ranges are desired (for example, 101 to 500 mg/kg, 501–1000 mg/kg,) these ranges can be substituted by codes, so that combinations can be processed easier.

In the search for inherent structure, more complex distributions on the measurements are made and compared with all other results to aid in selecting the direction of processing which improves the content measurement. These complex distributions include combinations of types and classes, Boolean relationships, conditioned relationships etc., all with the end goal of discovering the most persistant structure in the data files and building this up from that point of attack.

Another set of distribution tables are made from position identifiers. In some data files, action and/or reactions are listed over time. In these cases, it is of interest to know in a sequence of related actions taken from many examples, just what specific action precedes another since this could have bearing on some cause and effect relationship. Since such relationship need not be immediately following or contiguous, methods must be designed to search for this relationship. These positional distribution mappings also consider combinations, with Boolean conditions just as the measurement distributions do.

Finally, the distribution tables for mixed measurement and position distributions are made to derive the structure in the data files where the important information content appears to be contained.

XIII. How the System Works

The method of the present invention has certain specific goals in mind. These are partially described as follows:

1. Given a data base, what is the information content of this data base as measured by distribution studies?
2. What features (methods) reveal this information measurement?
3. What classes of data are involved in identification of information content?
4. What reduction or explosion has been necessary?
5. What cause and effect relationships have been identified?
6. What statistical methods apply for evaluating confidence levels and validation of results?
7. What feedback mechanisms are required?
8. What results are identifiable?

Figure 2:
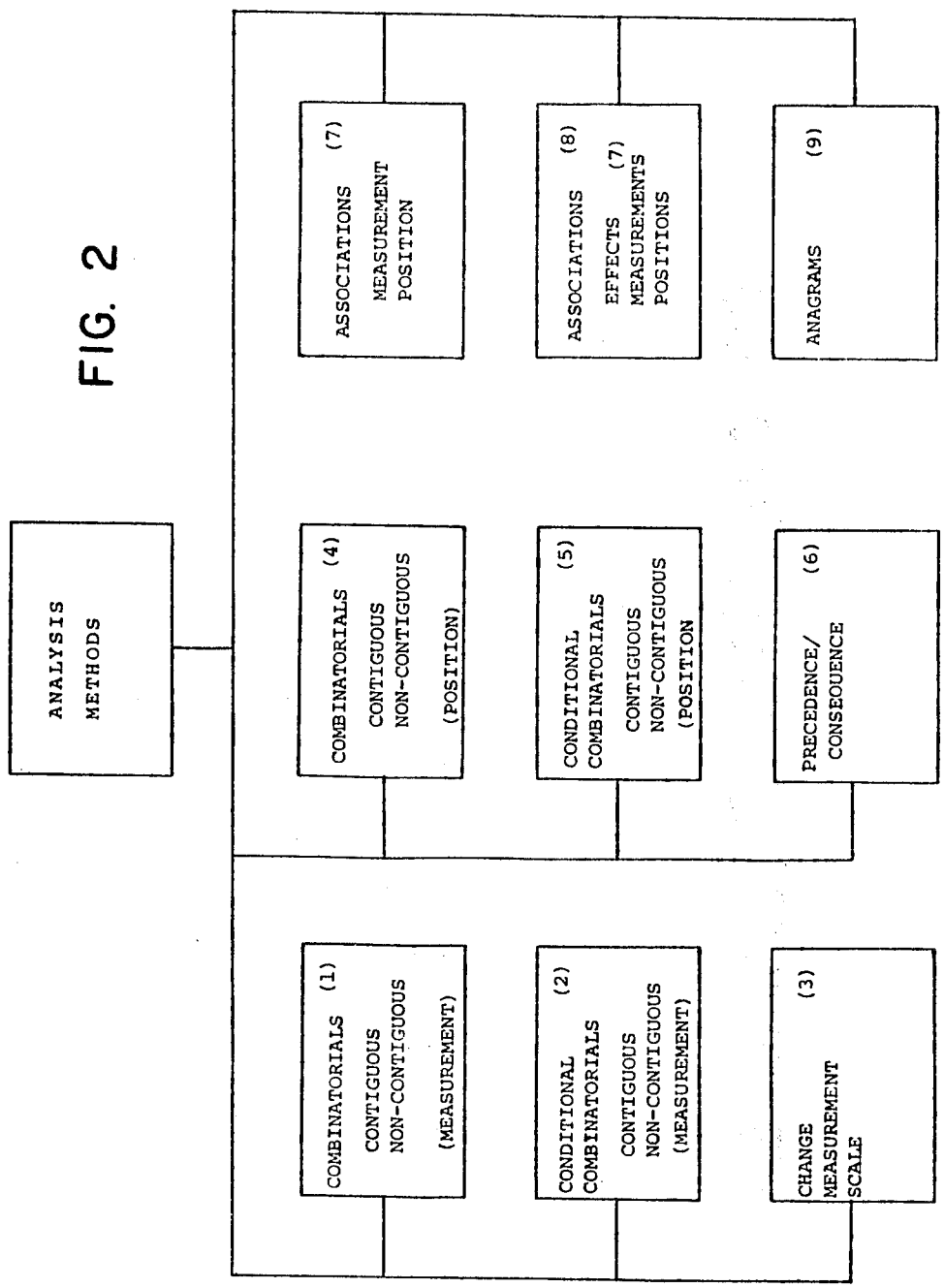
FIG. 2 is a block diagram representative of information organizational methods in accordance with the present invention.

The system of methods applied to resolve these goals are shown in the block diagram of FIGS. 1 and 2, which are representative of how data may be organized for analysis.

XIV. Information Measurement

In order to identify and measure information content in any given data base, certain a prior knowledge is essential. This knowledge may be resolved by asking questions, as follows:

1. How many parameters are involved?
2. What is the measurement dimension of these parameters?
3. What is the distribution of these parameters in their specific measurement domains—(i.e., normal, atypical, random)?
4. How do you normalize the different domains in order to integrate them?
5. What is the nature of the distribution mappings?
6. What positional relationships are relevant?
7. How many positions are involved?
8. What order in positions are involved (i.e., cause and effect)?
9. What is the distribution of the position entries?
10. How do you normalize these positional mappings in order to integrate them?
11. What combinations of measurement and position improve the distribution mappings?
12. What logical relationships or interactions are there which improve the distribution mappings?
13. What is the nature of the distribution mappings?

All of the above questions are resolved by the results of the distribution mappings on the original data as shown in FIG. 1. Data information is then organized in terms of the method of treatment selected, as shown by FIG. 2. The resolution determines which of the three structures explained above applies:

1. The information content is well defined and can be handled by conventional methods.
2. The information content is partially defined and requires closer analysis.
3. The information is undefined and appears random. In this last case, manipulation, reorganization and further analysis must be done and fed back through the information identification and measurement system. Sometimes the process must be repeated several times, or even many times, before a meaningful pattern appears.

XV. Information Organization Methods

The methods available in accordance with the present invention carry out many types of data reorganization in order to reveal inherent structures in the data files, and to eliminate irrelevant information. These methods include ordering, classifying, transposing, translating, transforming, combining, implementing to achieve symmetry and processing for input to the information measurement routines. They are selected partly by system schedule and partly as a result of feedback information from the information measurement routines, and application of other methods results. This feedback capability makes the method selection for processing the data dynamic and data-dependent. The overall procedure and many of the steps and subroutines are original and have not been found anywhere in the literature. They have been designed from needs set down in operational missions, and have resulted in detecting cause and effect relationships which were not known or suspected.

The basic steps of the method are shown in FIG. 2. The select numbers indicating the order in which the steps are performed is shown in the upper right hand corner of each block. The schedule is changed or stopped, however, by certain results from the information measurement routines. Examples of these basis methods are detailed below.

Figure 3:
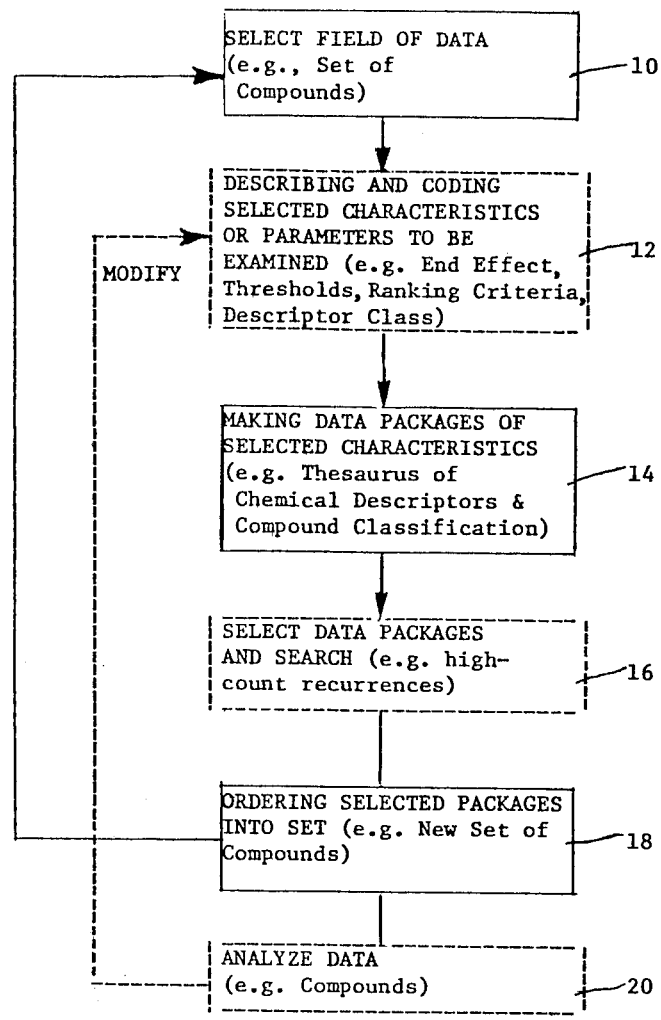
FIG. 3 is a block diagram showing the process of the present invention applied to analysis of compounds.

XVI. Description of FIGS. 3 and 4 and the Generalized Method of the Invention Having seen examples of the types of techniques employed in accordance with the present invention, it is now appropriate to return to the generality of the method of the present invention. FIG. 3 is a block diagram representing steps in a generalized process in accordance with the present invention. In the first step, 10, a limited field of data, for example, of chemical compounds in a specific area, or over the entire field of chemistry, is selected. The purpose of the process is to expand or limit the field and possibly supply a larger list or a complete list, of compounds which qualify. The field can be expanded by successive consideration of and elimination of other possible compounds.

Starting with the selected set of compounds, 10, each of these is subjected to an analysis or observation step 12 for specific parameters. Then each compound has the selected characteristics code, in a step 14 so as to form a data package so that there are data packages for each compound in the field. In this process an optional search can then be made using the selected characteristics, or predetermined ones of them, as a search description or criteria for selection of other chemicals to enlarge the data base, as indicated at 16.

With the enlarged field of information, the pattern may be observed for voids or asymmetry and a new set of compounds in a step 18 hypothesized. That new set is fed back to the beginning of the process to enlarge the data base and the process is repeated. This can be done repeatedly. Finally, the new set of compounds is analyzed, as shown in step 20, to determine whether the compounds are purely hypothetical or practical, and possibly, to determine what the compounds do in actual use. This includes analysis of their characteristics used as search parameters and may result in changing step the 12 to enlarge or reduce the field of search, for example, following which the processing must, of course, be repeated.

Figure 4:
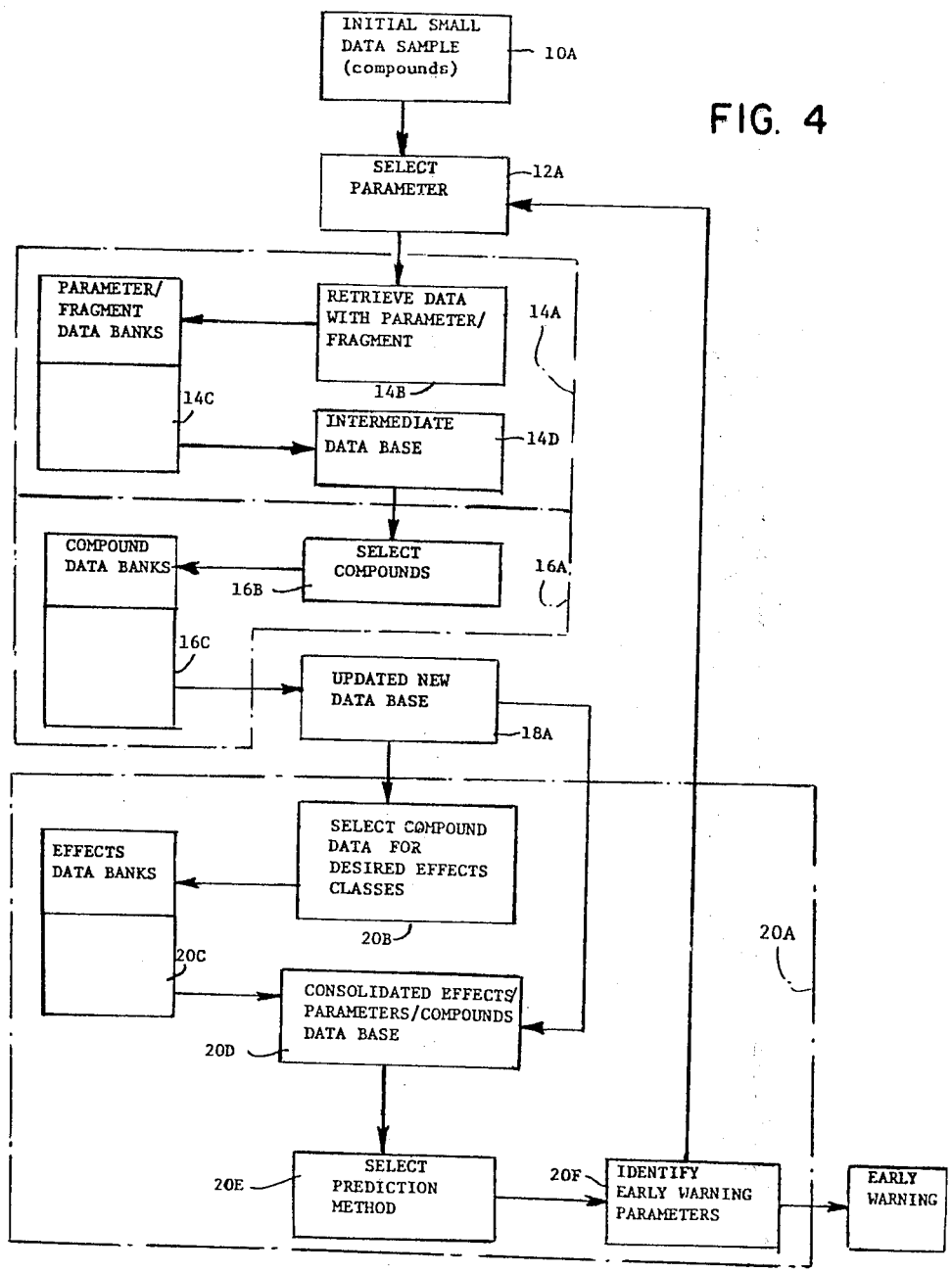
FIG. 4 is a block diagram of a more specific procedure useful with the process of FIG. 3.

FIG. 4 expands upon FIG. 3 by showing a specific technique or techniques at various stages of the process. Corresponding steps have the same reference number with the addition thereto of the suffix letter "A", or possibly are broken down into a plurality of substeps with a sequence of letter suffixes. Then, in making data packages, as in step 14A, a particular parameter selected (selected characteristic) is used to retrieve those data packages containing that parameter, as in step 14B. That parameter, in turn, is fragmented into other parameters which are, in turn, searched, as in step 14C and the selected characteristics (fragments) are retrieved to generate an intermediate data base, as in step 14D. From this intermediate data base chemical compounds are selected, step 16B, and compared to chemcial data banks, step 16C, to provide an augmented or updated data base, step 18A. This can be fed back, but preferably is submitted to analysis, step 20A, which, in this particular case, involves selection of compounds for desired effects, step 20B, to be compared with an effect data bank, step 20C, to determine a new data base, step 20D, with consolidated effects, parameter compounds, etc., adding to the general field. This base is subjected to a selected prediction method, 20E, which, in turn, generates early warning parameters, 20F, which can be fed back to modify determination of parameter selection, step 12A, or directly used in a new system as an early warning technique to detect those compounds having specified effects.

XVII. Several Aspects of the Mapping Techniques Appear in the Magic Squares Example An example of inherent structure revealed by the application of certain "mapping" selected from the data analysis is shown below.

The data files consist of one hundred 4×4 "magic squares", of which the following is as example:

| 1  | 15 | 14 | 4  |
|----|----|----|----|
| 12 | 6  | 7  | 9  |
| 8  | 10 | 11 | 5  |
| 13 | 3  | 2  | 16 |

The data measurement distribution for these hundred squares to show data element frequency is:

TABLE IV

| DATA ELEMENT-FREQUENCY | | | |
|---|---|---|---|
| 1 - 100 | 5 - 100 | 9 - 100  | 13 - 100 |
| 2 - 100 | 6 - 100 | 10 - 100 | 14 - 100 |
| 3 - 100 | 7 - 100 | 11 - 100 | 15 - 100 |
| 4 - 100 | 8 - 100 | 12 - 100 | 16 - 100 |

Table IV is representative of a value mapping type of distribution (the first mentioned in Table III). The mapping shows that every number appears on every one of the hundred cards or "magic squares".

This information about distribution alerts the system to search for symmetrical relationships. Positional distributions are selected, that is the distribution referred to as "positioning mapping" in Table III. by observation, it can be seen that:

(1) number position is a function of data element frequency; and (2) all positions have all data elements, i.e., each of the numbers 1-16 appears in every magic square.

The latter (2) observation is an n-gram. These observations suggest a change of radix. A binary base is selected and the magic square above becomes:

| 00001 | 01111 | 01110 | 00100 |
| 01100 | 00110 | 00111 | 01001 |
| 01000 | 01010 | 01011 | 00101 |
| 01101 | 00011 | 00010 | 10000 |

This change in terms of the types of distribution of Table III is an associational mapping. Information measurement distributions are made again with no additional information or relationships except that the most significant digit position has the lowest count.

The radix is changed to the binary of the decimal number minus one. The result is:

| 0000 | 1110 | 1101 | 0011 |
| 1011 | 0101 | 0110 | 1000 |
| 1100 | 0010 | 0001 | 1111 |
| 0111 | 1001 | 1010 | 0100 |

The information distributions are again observed. This time a new structure is discovered. This structure is that every 'bit' column has only 2 zero's and 2 ones. Symmetry has been revealed. Note that the system did not solve this problem of finding a way to generate all the squares, but it did find a structure which permits solution to this problem. Although this is a number theoretical data base, it is only described here to illustrate how the system works. With data files involving drug effects on rats no symmetry would appear. Also important to understand is that human interpretation of results can be exercised at each decision point.

XVIII. Conditioned Value Bigram Distributions

The object of this example is to demonstrate the application of "Conditioned Bigram Distributions" (see Table III above) to a problem area. The vehicle chosen for this example is a problem in logic which is both simple enough to complete entirely, and sufficiently complex to provide an example of a reduction-to-practice to Conditioned Bigram Distributions.

The logic problem is defined as an exercise in which two players alternate in drawing one or more counters (pennies, etc.) from a set of 12 counters arranged in three rows of 5, 4, 3 counters, respectively. Only one row at a turn may be drawn from, the object being to avoid drawing (or being left) the last counter. The following charts II and III represent two sequences of play, by way of example:

CHART II

|           |       |      |     | Code |
|-----------|-------|------|-----|------|
| START     | 11111 | 1111 | 111 | 543  |
| 1. PLAYER A | 11111 | 1111 | 1 | 541 |
| 2. PLAYER B | 111   | 1111 | 1 | 341 |
| 3. PLAYER A | 111   | 11   | 1 | 321 |
| 4. PLAYER B | 111   | 11   | 0 | 320 |
| 5. PLAYER A | 11    | 11   | 0 | 220 |
| 6. PLAYER B | 1     | 11   | 0 | 120 |
| 7. PLAYER A | 1     | 0    | 0 | 100 |

* WINNER - PLAYER A *

CHART III

| | | | | Code |
|---|---|---|---|---|
| START | 11111 | 1111 | 111 | 543 |
| 1. PLAYER A | 1111 | 1111 | 111 | 443 |
| 2. PLAYER B | 1111 | 1111 | 0 | 440 |
| 3. PLAYER A | 111 | 1111 | 0 | 340 |
| 4. PLAYER B | 111 | 111 | 0 | 330 |
| 5. PLAYER A | 11 | 111 | 0 | 230 |
| 6. PLAYER B | 11 | 11 | 0 | 220 |
| 7. PLAYER A | 11 | 1 | 0 | 210 |
| 8. PLAYER B | 0 | 1 | 0 | 010 |
| *** WINNER - PLAYER B *** | | | | |

NOTE: Each Move Indicates Those Counters Left By The Identified Player.

Charts II and III portray the progression of "moves" involved in two runs of the exercise and the associated numeric coding derived from those moves. It can be seen that although each exercise begins with 543 (representative of the counters in each of the three rows), the progression of moves can differ entirely, the two Charts being representative example.

Data for this analysis was acquired by noting each move of a number of exercises and associating the end result (win or loss) with that move. No prior knowledge of the rules for winning was assumed because the entire thrust of this analysis was to derive both those rules and predictive capability, regarding the final outcome of each move, directly from the data.

Analysis of the data indicated that the rightmost digit of the ordered numeric coding for each move associated with a winning outcome was always either a "1" or "0".

The following Chart IV displays all possible moves in the exercise and their association with the end result (win or lose).

CHART IV

| | | | |
|---|---|---|---|
| 543 L | 542 L | 541 W | 540 L |
| 533 L | 532 L | 531 L | 530 L |
| 443 L | 522 L | 521 L | 520 L |
| 433 L | 442 L | 511 L | 510 L |
| 333 L | 432 L | 441 L | 500 L |
| | 422 L | 431 L | 440 L |
| | 332 L | 421 L | 430 L |
| | 322 L | 411 L | 420 L |
| | 222 L | 331 L | 410 L |
| | | 321 W | 400 L |
| | | 311 L | 330 L |
| | | 221 L | 320 L |
| | | 211 L | 310 L |
| | | 111 W | 300 L |
| | | | 220 W |
| | | | 210 L |
| | | | 200 L |
| | | | 110 L |
| | | | 100 L |
| | | | 000 L |

The numerically coded moves were grouped by their rightmost digit and that digit was chosen as the condition on the distribution of the remaining digits.

Table V displays the Bigram Distribution of coded moves conditioned by (1) the terminal digits "1" and "0" and (2) a winning end result.

TABLE V

| FIRST POSITION | ALL WINNING MOVES SECOND POSITION | | | | |
|---|---|---|---|---|---|
| | 4 | 3 | 2 | 1 | 0 |
| 5 | | | | | |
| 4 | 0 | | | | |
| 3 | | 0 | 1 | | |
| 2 | | | 0 | | |

TABLE V-continued

| FIRST POSITION | ALL WINNING MOVES SECOND POSITION | | | | |
|---|---|---|---|---|---|
| | 4 | 3 | 2 | 1 | 0 |
| 1 | | | | 1 | |
| 0 | | | | | |

The vertical axis represents the initial digit of a coded move and the horizontal axis represents the second digit of that coded move. The body of the table contains the rightmost (conditioning) digit(s) of that coded move. It is apparent that every possible winning move in the logic problem is represented in Table V. Table V represents winning in those places where a zero (0) or one (1) appears in the field. For example, the winning move 541 is represented in Table V by a position opposite 5 along the first position row and a 4 along the second position column which displays a 1 (conditioning digit) in the field (upper leftmost cell of the Table). Table V shows that the only winning move with a 5 in the first position must have a 4 in the second position and a 1 as the conditioning digit. The Table shows that there are no winning moves beginning with 53 or 50, for example.

The same interpretation applies to Table VI which is the complement of Table V, however the game losing logic is more complex. The same approach can be used to solve the problem if any desired number of counters and rows is selected as the initial starting point for the game.

Table VI, presented only as a point of interest, is the complement of Table V in that it represents every losing move. Table VI, however, must be produced in order to determine which strategy is the better; particularly if the scope of the problem is expanded.

TABLE VI

| FIRST POSITION | ALL LOSSING MOVES SECOND POSITION | | | | |
|---|---|---|---|---|---|
| | 4 | 3 | 2 | 1 | 0 |
| 5 | 3,2, 0 | 3,2, 1,0 | 2,1, 0 | 1,0 | 0 |
| 4 | 3,2, 0 | 3,2, 1,0 | 2,1, 0 | 1,0 | 0 |
| 3 | | 3,2, 1 | 2,0 | 1,0 | 0 |
| 2 | | | 2,1 | 1,0 | 0 |
| 1 | | | | 0 | 0 |
| 0 | | | | | |

The winning moves (Table V) could have been isolated from the data by a straightforward combinatorial approach; the small number of parameters in this trivial example would require very little manual or computer time. However, in the case of a large data base with hundreds of thousands of parameters to consider combinatorally, the computer execution time and cost can be prohibitive or impossible for the straightforward combinatorial approach.

The conditioned combinatorial distribution approach, described in Table III as "Boolean, " radically shortcuts the time and costs required to extract combinatorial distribution patterns from a large data base. The conditions, which can be based on empirical analyses of the data, specify that only certain data parameters associated with those conditions are to be combinatorially processed thereby, reducing the execution time and costs by orders of magnitude.

XIX. Distribution of Antecedents Consequence Method

This method is subpart of the whole process for determining information structure. An example of how it works is found in the simple, trivial example of the counters described above, but it applies to the procedures to determine the sequence patterns of the amino acids in biological cells which can only be handled by a computer runs. It is needed because there exists no mathematical way, in statistics, in other mathematics, nor, any method using pure cryptanalysis to handle the problem of prior associations of order that are not nearest neighbors. By "nearest neighbors" is meant an occasional technique whereby two elements which are being investigated occur directly contiguous to one another. In this instance, we are concerned with a situation where the sequence of occurrences is important but the position need not be restricted to the contiguous. The method of the invention applied in this area identifies those relationships that always follow other specific relationships, which is a requirement of cause and effect determination.

The method is used where nearest neighbor distributions break down and where statistics yield no structural properties or information. A random appearing distribution table results if contiguous element frequency distribution analysis does not give any significant differences. In other words, the nearest neighbor procedure "breaks down" when the results produced do not provide a significant distribution.

The method works where a collection of factors, event or distributions occur in a certain group, which group defines a process or a family of generators or an associated environment, and one is interested in determining what kind of order is associated with that group among the elements or the factors. This order may be time-related, it may be space related, such as a geometrical structure. It may be operations related, such as in manufacturing operations. It may be related in other phases in the sense that one process or one structure must preceed another one, and never follow. For example, an adverse effect to a drug follows taking the drug.

The problem of identifying cause and effect relationships is dependent upon determining the percentage of times any event or coded event occurs in a sequence of events which represent some historical record. The method for determining this percentage is shown in the next section, Section XX entitled "Simple Examples of Antecedents Consequence".

There is an additional problem encountered in searching for this order relationship of always following a specified action, and that problem is that it may happen more than once, and, in addition, it may happen quite late, with many intervening actions coming in between. Procedurally, then, when one builds his tables up to show such possibilities, he will be counting many things more than once, so, mathematically stated, it is a many to-one-relationship.

The tables are built by the following procedure. All factors are represented by a letter or a code. These letters appear in groups which are, in essence, a representation of the sequence of events in a process or application. A distribution summary of all events pairs anywhere in sequence is made on a positional relationship, the simplest being that of merely preceeding or following. This can be expanded to include any occurrance of the letters or codes, no matter what the separation between. The results may be tabulated by frequency of occurrences.

Another new table can be made which is a percentage table. This takes any pair or letters, like AB, looks it up and then takes the reverse of it "BA" and looks that up and makes a percentage of AB/BA. In such a table, wherever you have 100 percentages, you have identified those critical things that always follow. Where there is a 50/50 ratio, trivial information has been identified and another method in the system is pursued.

The percentage table is then analyzed to determine where the high (or sometimes low) percentages are. These situations represent the candidates for cause and effect determination later. It is the high percentage effects which one is concerned with. Those seeking information for prediction purposes are interested in the very high or the very low percentages in the table. Cut off may be somewhat arbitrarily chosen where the antecedents consequence table has no values higher than 80%. Then, go to conditional methods and preferably conditional associational methods to find something alone that has to be added before reprocessing data.

When starting out, how far to go, for example, when not limiting ones self to contiguous members depends on the next step.

XX. Simple Examples Of Antecedents Consequence

In order to describe the situation one finds oneself in when faced with modern problems such as medical etiology of disease, failure identification, market response, demographic behavior etc. consider a randomly constructed situation as follows:

A. You are given the following number of colored balls:
 1. 30 orange balls
 2. 30 white balls
 3. 20 green balls
 4. 10 violet balls
 5. 10 black balls B. Place all of these balls in a ballot box and pick them out at random in sequences of five at a time and construct 20 sets of five in the order that you picked them out.

| | | |
|---|---|---|
| 1. O G W V W | 8. B W O O W | 15. V W G W O |
| 2. G O W G V | 9. V G W O B | 16. O W O G V |
| 3. W G O W W | 10. W O W W O | 17. B O G W W |
| 4. B O B O G | 11. O V O G G | 18. W O O G B |
| 5. G B W V O | 12. W O G W W | 19. G W V O W |
| 6. O B O W G | 13. V W O O G | 20. B W G O O |
| 7. W O G V B | 14. W W W O O | |

Now construct an antecedence-consequence matrix in the following way:
1. Take each 5-letter set, such as O G W V W and list the letters which follow 0 in pairs. (OG, OW, OV, OW,)
2. Then list the letters that follow G. (GW, GV, GW)
3. Then list the letters that follow W. (WV, WW)
4. And finally the letters that follow V. (VW)

Continue this procedure for all the five-letter sets and then count the pairs and list them in a table such as Table VII (do not count double letters, i.e. WW etc.). In Table VII, the letters B,G,O, etc. in the first column represent the first letter of each pair, and the letters B,G,O, etc. in the first row represent the second letter of each pair. For example, the pair "WO" occurs 25 times.

TABLE VII

|   | B | G  | O  | V | W  |
|---|---|----|----|---|----|
| B | — | 5  | 10 | 1 | 7  |
| G | 4 | —  | 10 | 7 | 14 |
| O | 5 | 23 | —  | 6 | 14 |
| V | 2 | 7  | 8  | — | 6  |
| W | 3 | 10 | 25 | 6 | —  |

When Table VII has been constructed, convert it to percentages as shown below in Table VIII. (%=[ij]/[ij]+[ji] in which "i" is the row location and "j" is the column location for each letter. Thus, [ij] is the number of times "i" follows "j", and [ji] is the number of times "j" follows "i".—;

TABLE VIII

|   | B   | G   | O   | V   | W   |
|---|-----|-----|-----|-----|-----|
| B | —   | 55% | 66% | 33% | 70% |
| G | 44% | —   | 30% | 50% | 58% |
| O | 33% | 70% | —   | 43% | 36% |
| V | 66% | 50% | 57% | —   | 50% |
| W | 30% | 42% | 64% | 50% | —   |

By selection of the highest or lowest percentages from Table VIII, cause and effect can be determined. For example, the use of the above procedure in determining the cause of spacecraft battery failure was explained in Section IX above.

XXI. The Automated Association Methodology

The Automated Association Methodology provides an approach to determine whether two independent descriptions of the same phenomenon can be matched by machine methods.

In analysis applications, the Automated Association Methodology is used to determine quantitatively whether a given superposition has brought together two members of a similar class. The procedure followed is to juxtapose two literal strings (messages) to determine how often the elements of each string are identically matched. This test is computed for every practical juxtaposition of the two strings.

When the two springs are compared at the proper position, or positions, the values obtained show a significant correlation in comparison to the other positions and to the probabilities involved. The basis for this is that when two random element strings (where the elements of the string have an equal probability of occurrence) are juxtaposed, the probabilities imply that there will be about 3.85 matches per 100 elements (assuming 100 different elements in each string, the elements in each string being identical). If conventional English text is used to make up both strings, 6.67 matches per 100 letters (elements) will occur. This is based on the frequency characteristics of English text usage. These values are obtained for any random juxtaposition of the strings concerned. Should the strings be positioned so that a common word or phrase is matched in the juxtaposition, the matching value obtained will be significantly greater than 6.67%.

This methodology is functional on literal data (see test the example below) or coded data. Literal data can be transformed to representative codes, particularly when large data bases are to be analyzed for association of its elements to itself or to external data.

Conditions can be imposed on the data elements under analysis by this method. These conditions can include:
1. Combine elements and recode.
2. Ignore element.
3. Weight element. (positive and negative)
4. Position of element in data string.
5. Combinations of the above.

Feedback conditions can be imposed (1) prior to the initiation of analysis; (2) during the analysis (as indicated by insights from prior results) or; (3) in a re-analysis of the data to synthesize the phenomenon under investigation.

TEST EXAMPLE

To obtain insight into the application of this concept the following manual analysis was performed and its results recorded. Let us take the list of terms found in Tables IX and X as being typical of two subject classes.

TABLE IX

SAMPLE LIST - ELECTRONIC INVENTORY

ABSORBER, RADIO FREQUENCY RADIATION
ADAPTER, SWITCH ACTUATOR
ANTENNA CONTROL SYSTEM
BASE (1), RADAR SET TURNTABLE
METER ASSEMBLY, ELECTRICAL
BRIDGE, RESISTANCE
METER, ELECTRON TUBE TESTER
MULTIMETER, REPLACEMENT
RECORDER TAPE, TRANSISTORIZED
CONVERTER, FREQUENCY
METER, ELAPSED TIME
DECADE COUNTER
OSCILLOSCOPE ASSEMBLY
AMPLIFIER, ELECTRONIC CONTROL
FILTER, BAND SUPPRESSION
INDICATOR, ELECTRICAL POTENTIAL
PANEL, TEST, ELECTRICAL
REGULATOR SET VOLTAGE

TABLE X

SAMPLE TEST - ANTI-CANCER COMPOUNDS

6-PTERIDINEMETHANOL, 2-AMINO-4-HYDROXY-PYRIMIDINE, 2, 4-DIAMINO-5 (P—CHLORAPHENYL)-6-ETHYL-GLUTAMIC ACID, N—(N—PETEROYL-A-GLUTAMYL)-, SODIUM SALT PTERIDINE, 2, 4-DIAMINO-6, 7-DIPHENYL-4-PTERIDINOL, 2-AMINO-2, 4, 6, 7-PTERIDINETHETROL PTERIDINE, 4-CHLORO-2, 6, 7-TRIS (DIMETHLAMINO)-2-PTERIDINOL, 4-AMINO-6, 7-B15 (P—CHLOROPHENYL)-PYRIMIDINE, 4, 6-DIAMINO-5-NITROSO-2-(3-PYRIDYL)-PTERIDINE, 4-AMINO-4, 7-PTERIDINEDIOL, 2-MERCAPTO-6-METHYL-LUMAZINE 2, 4-PTERIDINEDIOL PYRIMIDINE, 2, 4-DIAMINO-6-(3, 4-DICHLORO-ANILINO)-PHENOL, 4, 4'-(2, DIAMINO-6, 7-PTERIDINEDIYL) DI-6-PTERIDINE CARBONITRILE, 2, 7-DIAMINO-4, 6, 7-PTERIDINETRIOL, 2-MERCAPTO-ALANINE, N—(P—AMINOBENZOYL)-2, 4, 7-PTERIDINETRIOL 6, 7-PTERIDINEDICARBOXYLIC ACID, 2, 4-DIAMINO-

The first is a random inventory from an electronics laboratory, and the other a list of compounds used as anticancer agents.

First we create a message string from each list of 120 letters, to be used as the gauge for each subject. For the electronic terms, the result is:

STRING I

ABSORBERRADIOFREQUENCYRADIA-
TIONADAPTERSWITCHACTUATORANTEN-
NACONTROLSYSTEMBASERADARSET-

TURNTABLEMETERASSEMBLYELECTRIC-ALBRID

Note that all the commas and word spaces have been deleted. In the case of the chemical compounds all nonalphabetics and spaces were deleted, resulting in the following letter string:

STRING II

PTERIDENEMETHANOLAMINOHYDROX-
  YPYRIMIDINEDIAMINOPCHLORO-
  PHENYLETHYLGLUTAMICACIDNN-
  PTEROYLAGLUTAMYLSODIUMSALT-
  PTERIDINEDIMINO

The next step was to take the descriptor "INTEGRATED CIRCUIT" and test it against the beginning of the string:

```
1          10           20
A B S O R B E R R A D I O F R E Q U E N C Y - -
I N T E G R A T E D C I R C U I T
``` recording the fact that there is 1 coincidence, shifting one position and finding a single coincidence.

```
          10           20
A B S O R B E R R A D I O F R E Q U E N C Y - -
  I N T E G R A T E D C I R C U I T
```

The process was continued until the descriptor was juxtaposed in the 100th position where there are two coincidences.

```
100         110          120
- - - E R A S S E M B L Y E L E C T R I C A L B R I D
      I N T E G R A T E D C I R C U I T
```

Since there are 17 letters in "INTEGRATED CIRCUIT" and it was tested at 100 positions, a total of 1,700 pairings was tested with the following result:

| COINCIDENCES | NO. OF POSITIONS |
|---|---|
| 0 | 32 |
| 1 | 35 |
| 2 | 17 |
| 3 | 11 |
| 4 | 3 |
| 5 | 1 |
| 6 | 1 |
| | 100 |

When "INTEGRATED CIRCUIT" was tested against STRING II, the following result was obtained:

| COINCIDENCES | NO. OF POSITIONS |
|---|---|
| 0 | 38 |
| 1 | 36 |
| 2 | 21 |
| 3 | 5 |
| | 100 |

The next step was to take the compound LUMAZINE, 6,7-DIMETHYLTHIO and after stripping it of its nonalphbetics, tested "LUMAZINEDIMETHYLTHIO" against STRINGS I and II at the first 85 positions to get 1,700 pairings (this descriptor is 20 letters in length) with the following results:

TABLE XI

| STRING | COINCIDENCES | NO. OF POSITIONS |
|---|---|---|
| I | 0 | 36 |
| ELECTRONIC | 1 | 27 |
| INVENTORY | 2 | 17 |
|  | 3 | 5 |
|  |  | 85 |
| II | 0 | 37 |
| ANTI-CANCER | 1 | 26 |
| COMPOUNDS | 2 | 10 |
|  | 3 | 4 |
|  | 4 | 3 |
|  | 5 | 3 |
|  | 6 | 1 |
|  | 7 | 1 |
|  |  | 85 |

An examination of the results of 1,700 attempted matchings of "INTEGRATED CIRCUIT" against STRINGS I and II resulted in the following:

TABLE XII

| STRING | SUCCESSFUL MATCHES | % | 0-3 COINC./POS | 4 OR MORE COINC./POS |
|---|---|---|---|---|
| I ELECTRONIC INVENTORY | 125 | 7.4 | 95 | 5 |
| II ANTI-CANCER COMPOUNDS | 93 | 5.5 | 100 | NONE | and for matching of "LUMAZINEDIMETHYULTHIO":

TABLE XIII

| STRING | SUCCESSFUL MATCHES | % | 0-3 COINC./POS | 4 OR MORE COINC./POS |
|---|---|---|---|---|
| I ELECTRONIC INVENTORY | 76 | 4.5 | 85 | NONE |
| II ANTI-CANCER COMPOUNDS | 98 | 5.75 | 77 | 8 |

The percentage of success for each set of comparisons was well within the limits dictated by the probabilities and each descriptor successively selected the correct string. It must be pointed out that despite the care taken not to use a descriptor containing literal strings that match any in the test strings, there were positions of significant correlation such as the case of seven matches for a 20-letter overlap giving a 35% matching success. These long matching strings should exist when comparing equipment specifications that are the same. Where two equipments have several common characteristics, the choice of which of the two equipments more nearly matches a third would be based on which one has the higher number of long positional coincidences.

This technique suggests itself when a computer is required to search the file for the equipment in the file which most closely matches a set of required characteristics. In this case, the test descriptor would be a string composed of the characteristics required.

XXII. Data-Dependent Dynamic Indexing And Commonality Determination

This procedure is a system of computer programs for automated index generation, nomenclature standardization, file restructing, data classification, and data storage and retrieval. These functions are accomplished by conditioned associations for extracting indexes or "words" from the data in a standard manner and utilizing the "words" as representatives of the data content and context.

To demonstrate the application of this technique, we will assume that a data file, such as an inventory or catalog-type file, is on hand. This hypothetical file will have a fixed portion of each line item record dedicated to a language description or nomenclature of the item involved.

The following definitions apply to the terminology of the instructions for index extraction:

1. A descriptor word is defined as a continuous group of alphabetic characters, delimited by spaces or nonalphabetic characters, within the nomenclature field of a line item record.
2. A descriptor phrase is defined as one or more descriptor words, delimited by spaces or nonalphabetic characters, within the nomenclature field of a line item record.
3. A descriptor noun is defined as the generic name of the item it describes. For example, the descriptor noun in all of the following descriptor phrases is GAGE:
   (A) GAGE BLOCK.
   (B) GAGE ADAPTER.
   (C) GAGE PIN.
   (D) GAGE PLUG PLAIN GO.
   (E) GAGE AIR PRESSURE.
4. A modifier is defined as the word or words in a descriptor phrase, other than the descriptor noun, that quanlify and/or qualify the descriptor noun.
5. An index word is defined as a group of characters which has been extracted from a descriptor word. The number of characters in an index word may range from 1 to n.
6. A derived index is defined as a group of index words. The number of index words in a derived index may range from 1 to n.

The following steps are taken to extract the index words from the descriptors phrases:

1. The nomenclature field of the data file is visually analyzed to determine the quantity of index words required to reflect the information content of the descriptor phrase. The number of characters contained in each index word must also be decided. The descriptor noun, which must be the first word in the descriptor phrase, should generate the longest index word because it represents the generic name of the data item.

Our hypothetical file is structured so that four index words will represent any descriptor phrase, and therefore any line item, in the data file. The index words are identified and structured as follows:

A. INDEX WORD 1.—The first letter of the first word in the descriptor phrase plus the next two consonants. Example: ADAPTER=ADP.

B. INDEX WORD 2.—The first letter of the second word in the descriptor phrase plus the next consonant. Example: ADAPTER, CLAMP-ON=ADP CL. If the descriptor phrase consists of less than two words, the INDEX WORD 2 is made from the next two consonants in the residue of the descriptor phrase after INDEX WORD 1 is generated. Example: ADAPTER=ADP TR.

C. INDEX WORD 3.—The first letter of the third word is the descriptor phrase. Example: BLOCK, GAGE SET=BLC GG S. If the descriptor phrase consists of less than three words, the INDEX WORD 3 is made from the next consonant in the residue of the descriptor phrase after INDEX WORDS 1 and 2 are generated. Example: ACCESSORY SCANNER=ACC SC N.

D. INDEX WORD 4.—The first letter of the fourth word in the descriptor phrase. Example: ADAPTER, WAVEGUIDE TO COAX=ADP WV T C. If the descriptor phrase consists of less than four words, the INDEX WORD 4 is made from the residue of the descriptor phrase after INDEX WORDS 1, 2, and 3 are generated. Example: AMPLIFIER, BROAD BAND - AMP BR B N.

E. INDEX WORDS that can not be filled with letters, due to a short descriptor word or phrase, are filled with blanks. Example: CABLE=CBL ## # # (Note: #=blank).

Many other configurations and lengths may be utilized for the construction of index words; analysis of the data and practice will determine the optimum configuration of the index words which will most accurately reflect the information content of the descriptor phrase.

The descriptor phrase may contain numeric information as well as alphabetic. An index to represent the numerics fields in a base 16, or hexadecimal number system. This system is used so that a positive value can be assigned to both zero (0) and decimal points(.). Zero can be represented by $C_{16}$ and decimal points by $D_{16}$. These values are necessary for the representation of quantified data; for example, if zeros and decimal points were not assigned a specific value, it would be impossible by the sum-of-the-digits-method to automatically differentiate between the following "condenser" capacitance values:

| (A) | 900 | MFD |
| (B) | 90 | MFD |
| (C) | 9 | MFD |
| (D) | .9 | MFD |
| (E) | .09 | MFD |
| (F) | .00009 | MFD |

The index generated from the sum-of-the-digits can lead to error conditions because the digit by digit sum of the numeric fields "123456" and "214365" are alike. This possible error condition can be eliminated by generating another index or indexes from the most and/or least significant portion of the numeric field in conjunction with the sum-of-the-digits index.

Analysis of the data file, prior to index extraction, may reveal the presence of superfluous words such as "of," "by," "in," "ft," which do not contribute information content to the index. These words should be edited out of the data records in an editing phase of the computer program that performs the index extraction.

After the several indexes have been extracted and appended to each data record, the data file is restructured and organized by sorting on the index words. Numeric index words, if present, are usually the sort minor and the sort sequences through the alphabetic index words from WORD NO. 4 to WORD NO. 1, the descriptor noun index, which is the sort major.

Once the data file has been restructured and organized, the derived index can be used as a reference or label for data storage and retrieval. Another index, which may be shorter or reflect some functional aspect of the data item, can be automatically imposed utilizing the derived index as a reference.

XVIII. Commonality

Commonality is defined as an associative property belonging equally to or shared alike by two or more things. Thus, two or more data records which describe the same data item are "common". Commonality determination is a particular problem when data from several files are merged together or when multiple records describing the same item exist within a file. These problem areas are further compounded by the high probability that the several records which describe a discrete data item differ in spelling, abbreviations, spacing and syntax.

To "clean-up," condense, and standardize nomenclature in a data field of any size requires the automatic determination of commonality between data records. This is accomplished as a function of the derived indexes generated by the "Data Dependent Dynamic Indexing" System.

Examination of the data examples that follow will show that, despite the many differences in the descriptor field of each record, the method of index generation produced derived indexes which obviated the differences. The procedures required for automatic commonality determination are as follows:

1. The data file is processed through the "Data Dependent Dynamic Indexing" System to generate a set of derived indexes from, and appended to, each record.
2. The data file must now be sorted on the derived indexes. The first word, or descriptor noun index, is the sort major.
3. A computer program compares the derived indexes. Commonality exists when the derived indexes are identical.
4. The data are subset by the descriptor noun index which specified the generic name of the data item.
5. The data are further subset by the modifier indexes which follow the descriptor noun index.
6. The program can now condense the several records within each subset to a single record or carry each record within the subset individually but impose a common descriptor phrase to each number of the subset.

Table XIV lists the description phrases and corresponding index words derived according to the procedures described above for the Western Electric Warehouse Inventory problem described above in Sections IX and XXI through XXIII.

XXIV. Positional Distributions

When information is reduced to coded forms for ease in machine processing the positional relationships and/or distributions become very informative and useful. These distributions may be fixed points of reference, order-dependent, or relative point of reference. For example, in manufacturing processes it has been discovered that certain combinations of processes must be done in one order and not in the reverse order. Heat treatments of metals in one type of manufacturing must be done before coating. In another type of manufacturing the coating must be done first for binding reasons.

It is not always possible to ascertain this order of processing until the parts failure records have been obtained.

The method for establishing the cause and effect relationship is to obtain distributional tables in a generalized procedure for examining all of the ordering sequence possibilities. For example: Process A may be immediately followed by Process B, or it may be followed with some other process C (not relevant) and then Process B. This is represented by A.B, A. . B, A. . . B etc.

At present there is no formalization system to accomplish list distributional search for internal data structure. In the example given in Table X above the aminoacids are all run on the A 'n–dot' B distributional arrays to identify the critical positional factors. The clearest example is shown in language structure analysis, where i.g. or t. . n as terminal letter sequences for English words will turn up to mean '—ing' and 'tion' much more frequently than random expection. In scentific and industrial applications these distributions indicate a candidate phenomena for additional cause and effect analysis.

TABLE XIV

| DERIVED INDEX WORDS | | | | | | DESCRIPTOR PHRASE |
| (NOUN) 1 | 2 | 3 | 4 | 5 | 6 | |
|---|---|---|---|---|---|---|
| ANC | PL | B | P | 51P | 12 | ANCHOR PLSTC B ½ × 1 15P |
| ANC | PL | B | P | 51P | 12 | ANCHOR PLSTC B ½ × 1 PKG15 |
| ANC | PL | B | P | 51P | 12 | ANCR PLSTC B ½ × 1 PKG15 |
| ANC | PL | D | P | 8P6 | 15 | ANCHOR PLASTIC D 16 PKG8 |
| ANC | PL | D | P | 8P6 | 15 | ANCHOR PLSTC D 16 8P |
| ANC | PL | D | P | 8P6 | 15 | ANCR PLSTC D16 PKG8 |
| ADP | BR | DG | GDR | | 2 | ADAPTER BRDG DS 19252 L2 |
| ADP | BR | DG | GDR | | 2 | KS 19252 L2 ADPT BRDG |
| ADP | BR | DG | GDR | | 3 | ADAPTER BRDG KS 19252 L3 |
| ADP | BR | DG | GDR | | 3 | KS 19252 L3 ADPT BRDG |
| ANC | SC | WL | B | 8P4 | 12 | ANCHOR SC WL B4 PK8 |
| ANC | SC | WL | B | 8P4 | 12 | ANCHOR SCR WALL B 4 PKG8 |
| ANC | SC | WL | B | 8P4 | 12 | ANCHOR SCREW WALL B4 8P |
| ANC | SC | WL | B | 8P4 | 12 | ANCR SCR WL B 4 PKG8 |
| CKS | TL | A | | 162 | 13 | CONS TEL 4A2 61 |
| CKS | TL | A | | 162 | 13 | CONSOLE TEL 4A2 61 |
| CKS | TL | A | | 162 | 13 | CONSOLE TELEPHONE 4A2 61 |

XXV. Classification by Coding

Toxic effects measurements on 110 chemical compounds were extracted from the RTECS file discussed above in Section X. These measurements were (1) 'oral mouse $LD_{50}$', (2) 'oral rat $LD_{50}$', and 'inraperitoneal mouse $LD_{50}$' where $LD_{50}$ denotes that the given doses of the chemical resulted in the death of 50% of the test population. Oral and intraperitoneal denote the routes of administration of the chemical.

The measurements were processed through a computer program in order to calculate the correlation coefficient between two sets of variables. Three computer runs were made on the above measurements as follows:

1. Oral Mouse $LD_{50}$ vs Oral Rat $LD_{50}$
2. Oral Mouse $LD_{50}$ vs IPR Mouse $LD_{50}$
3. Oral Rat $LD_{50}$ vs IPR Mouse $LD_{50}$ The resulting correlation coefficients ranged from 65% to 83%.

The 110 sets of $LD_{50}$ measurements were then listed (see Table XV) and assigned a column code of "A" for oral mouse, "B" for oral rat, and "C" for IPR mouse. A three-letter codeword was then developed from the three measurement entries for each of the 110 chemicals. The codeword was ordered so that the code letter for the highest measurement value for a chemical was first, the next highest measurement was second, and the remaining measurement last. For example, given a set of measurement values A/21, B/23, C/2, the resulting codeword is BAC.

The resultant codewords were subjected to a frequency distribution which indicated that BAC occurred 42 times and ABC occurred 39 times. The remaining codewords occurred at very low frequencies. The chemical compound class associated only with BAC were processed through the correlation coefficient program as was the class of compounds associated with ABC. The resulting correlation coefficients for the coded classes of measurements ranged from 89% to 95% as opposed to 65% to 83% for the measurements as a whole.

Thus, an inherent structure was uncovered by coding and distribution procedures for subsequent scientific evaluation. This procedure provides insights toward developing other structures with the data. For example, the outlying measurements, where there is a large deviation between oral rat, oral mouse, and IPR mouse, can be related to chemical substructure fragments to determine the mechanisms of toxicity.

TABLE XV

| | ORAL MOUSE $LD_{50}$ | ORAL RAT $LD_{50}$ | IPR $LD_{50}$ | CODE |
|---|---|---|---|---|
| 1. | 21 | 23 | 2 | BAC |
| 2. | 2640 | 3400 | 1320 | BAC |
| 3. | 4620 | 5090 | 3200 | BAC |
| 4. | 600 | 975 | 500 | BAC |
| 5. | 338 | 2400 | 700 | BCA |
| 6. | 21 | 2000 | 2.6 | BAC |
| 7. | 2150 | 2150 | 300 | BAC |
| 8. | 4 | 0.22 | 15 | CAB |
| 9. | 1100 | 3000 | 1400 | BCA |
| 10. | 78 | 278 | 40 | BAC |
| 11. | 1220 | 1650 | 660 | BAC |
| 12. | 139 | 52 | 60 | ACB |
| 13. | 170 | 170 | 170 | ABC |
| 14. | 96 | 64 | 42 | ABC |
| 15. | 268 | 84 | 11 | ABC |
| 16. | 833 | 2630 | 65 | BAC |
| 17. | 464 | 440 | 492 | CAB |
| 18. | 300 | 200 | 230 | ACB |
| 19. | 812 | 3249 | 250 | BAC |
| 20. | 600 | 115 | 50 | ABC |
| 21. | 400 | 622 | 198 | BAC |
| 22. | 280 | 200 | 126 | ABC |
| 23. | 168 | 162 | 250 | CAB |
| 24. | 200 | 660 | 340 | BCA |
| 25. | 28 | 1300 | 9 | BAC |
| 26. | 841 | 1072 | 750 | BAC |
| 27. | 4700 | 3800 | 468 | ABC |
| 28. | 720 | 710 | 220 | ABC |
| 29. | 2370 | 2530 | 1460 | BAC |
| 30. | 350 | 132 | 2.8 | ABC |
| 31. | 1851 | 100 | 437 | ACB |
| 32. | 450 | 2221 | 300 | BAC |
| 33. | 92 | 86 | 12 | ABC |
| 34. | 196 | 57 | 30 | ABC |
| 35. | 84 | 84 | 111 | CAB |

(Part 2)

| | A ORAL MOUSE $LD_{50}$ | B ORAL RAT $LD_{50}$ | C IPR $LD_{50}$ | CODE |
|---|---|---|---|---|
| 36. | 438 | 400 | 396 | ABC |
| 37. | 12800 | 2800 | 4675 | ACB |
| 38. | 5040 | 11700 | 961 | BAC |
| 39. | 80 | 80 | 49 | ABC |
| 40. | 233 | 710 | 90 | BAC |
| 41. | 823 | 242 | 168 | ABC |
| 42. | 344 | 207 | 25 | ABC |
| 43. | 4800 | 1000 | 3590 | ACB |
| 44. | 4 | 4 | 3 | ABC |
| 45. | 625 | 1480 | 122 | BAC |
| 46. | 275 | 502 | 85 | BAC |
| 47. | 5700 | 4200 | 790 | ABC |
| 48. | 1230 | 1480 | 536 | BAC |
| 49. | 4300 | 3000 | 1710 | ABC |
| 50. | 114 | 856 | 56 | BAC |
| 51. | 3750 | 2800 | 650 | ABC |
| 52. | 1100 | 1210 | 940 | BAC |
| 53. | 380 | 590 | 300 | BAC |
| 54. | 12961 | 17000 | 6900 | BAC |
| 55. | 133 | 2 | 100 | ACB |
| 56. | 1400 | 1200 | 60 | ABC |
| 57. | 360 | 604 | 150 | BAC |
| 58. | 979 | 319 | 64 | ABC |
| 59. | 650 | 440 | 108 | ABC |
| 60. | 22000 | 17000 | 14000 | ABC |
| 61. | 26 | 30 | 8 | BAC |
| 62. | 10 | 37 | 5 | BAC |
| 63. | 80 | 40 | 60 | ACB |
| 64. | 388 | 297 | 5 | ABC |
| 65. | 250 | 600 | 200 | BAC |
| 66. | 808 | 807 | 125 | ABC |
| 67. | 410 | 350 | 32 | ABC |
| 68. | 3340 | 53 | 5.9 | ABC |
| 69. | 214 | 85 | 158 | ACB |
| 70. | 75 | 18 | 7 | ABC |

(Part 3)

| | | | | |
|---|---|---|---|---|
| 71. | 162 | 14 | 14 | ABC |
| 72. | 3860 | 4000 | 1299 | BAC |
| 73. | 800 | 1790 | 200 | BAC |
| 74. | 33 | 38 | 72 | CBA |
| 75. | 300 | 414 | 360 | BCA |
| 76. | 3000 | 2680 | 500 | ABC |
| 77. | 45 | 30 | 26 | ABC |
| 78. | 467 | 350 | 75 | ABC |
| 79. | 336 | 225 | 115 | ABC |
| 80. | 117 | 20 | 87 | ACB |
| 81. | 176 | 20 | 33 | ACB |
| 82. | 140 | 152 | 165 | CBA |
| 83. | 85 | 76 | 65 | ABC |
| 84. | 2000 | 906 | 118 | ABC |
| 85. | 7200 | 6900 | 1580 | ABC |
| 86. | 120 | 180 | 94 | BAC |
| 87. | 1520 | 2050 | 700 | BAC |
| 88. | 24000 | 21000 | 11400 | ABC |
| 89. | 160 | 150 | 73 | ABC |
| 90. | 1900 | 1900 | 4000 | CAB |
| 91. | 1530 | 1320 | 1320 | ABC |
| 92. | 890 | 945 | 471 | BAC |
| 93. | 2000 | 3980 | 250 | BAC |
| 94. | 235 | 515 | 65 | BAC |

TABLE XV-continued

| | | | | |
|---|---|---|---|---|
| 95. | 121 | 118 | 73 | ABC |
| 96. | 260 | 3890 | 190 | BAC |
| 97. | 7 | 0.5 | 0.85 | ACB |
| 98. | 980 | 2570 | 243 | BAC |
| 99. | 1400 | 1890 | 580 | BAC |
| 100. | 815 | 1000 | 420 | BAC |
| 101. | 900 | 1600 | 640 | BAC |
| 102. | 4000 | 3000 | 2602 | ABC |
| 103. | 3100 | 2250 | 908 | ABC |
| 104. | 88 | 140 | 71 | BAC |
| 105. | 1200 | 700 | 66 | ABC |
| (Part 4) | | | | |
| 106. | 14700 | 1100 | 200 | ABC |
| 107. | 8500 | 2500 | 960 | ABC |
| 108. | 4.5 | 12 | 3 | BAC |
| 109. | 480 | 1750 | 73 | BAC |
| 110. | 350 | 350 | 31 | ABC |

The present invention has been presented in terms of various examples. Possible areas of application have also been analyzed. It will be clear to those familiar with related arts that the examples are but a small number of almost endless applications of the invention some of which will develop in the future as new disciplines develop. The scope of the claims contemplates wide ranges of application of the invention. All methods and apparatus within the scope of the claims are intended to be within the scope and spirit of the present invention.

I claim:

1. A method of identifying physical items with specific characteristics and sorting those items from a relatively large group of physical items, said method comprising the steps of:
   (a) providing descriptive names for the items in said group,
   (b) encoding said names and storing the corresponding codes in computer memory,
   (c) providing one or more descriptor words describing said specific characteristics,
   (d) encoding said descriptor words and storing the corresponding codes in computer memory,
   (e) sequentially matching said descriptor word codes with said name codes in a computer on a character-by-character basis,
   (f) counting the number of character coincidences for each of said names,
   (g) identifying each of said names for which the number of coincidences significantly exceeds the random coincidence level for the characters in said descriptor words and names, and
   (h) restructuring and organizing said physical items by sorting said physical items on the basis of said names so identified.

2. A method as in claim 1 for identifying physical parts in a parts inventory, said descriptor words describing the desired structural characteristics of said parts.

3. A method as in claim 1 for indicating the probable toxicity of chemical substances, in which said decriptor word or words describe a chemical substance whose toxicity is unknown and said names describe chemical substances whose toxicity is known.

4. A method as in claim 1 in which the step of encoding descriptor words includes the step of abbreviating the first descriptor word by using only its first letter and the next two consonants.

5. A method as in claim 4 in which the second of said descriptor words is abbreviated by using only its first letter and the next consonant.

6. A method as in claim 5 in which each descriptor word after the second is abbreviated by limiting it to its first letter.

* * * * *

UNITED STATES PATENT AND TRADEMARK OFFICE
CERTIFICATE OF CORRECTION

PATENT NO. : 4,414,629  
DATED : November 8, 1983  
INVENTOR(S) : John H. Waite

Page 1 of 3

It is certified that error appears in the above-identified patent and that said Letters Patent are hereby corrected as shown below:

Face of Patent, before [21] Appln. No.: 205,339 - insert -
    Assignee: Computer Predictions, Inc., 19 Dogwood Drive, Brookside, N.J. 07926

Before start of specification - insert - Table of Contents as follows:

TABLE OF CONTENTS

- I. Field of the Invention
- II. Objects of the Invention
- III. Summary of the Invention
- IV. Description of the Drawings
- V. General Description
- VI. Identification of Information Structure
- VII. The Necessity for Organization and Re-organization of Data Files
- VIII. Toxic Data Base
- IX. NASA NiCd Spacecraft Battery Failure File
  - Table I - Failure Characteristics
  - Table II - Cell Failure Characteristics
- X. The RTECS File
  - Chart 1 - Route/Species Ordered Effects By Class (Cholinesterase Inhibitors)
- XI. Western Electric Warehouse Inventory
- XII. Description of Fundamental Methods
  - Table III - Types of Distributors
- XIII. How the System Works
- XIV. Information Measurement
- XV. Information Organization Methods
- XVI. Description of Figures 3 and 4 and the Generalized Method of the Invention
- XVII. Several Aspects of the Mapping Techniques Appear in the Magic Squares Example Table IV - Data Element-Frequency

UNITED STATES PATENT AND TRADEMARK OFFICE
CERTIFICATE OF CORRECTION

PATENT NO. : 4,414,629

DATED : November 8, 1983

INVENTOR(S) : John H. Waite

It is certified that error appears in the above-identified patent and that said Letters Patent are hereby corrected as shown below:

XVIII.  Conditioned Value Bigram Distributions
        Chart II
        Chart III
        Chart IV
        Table V - All Winning Moves
        Table VI - All Losing Moves XIX.  Distribution of Antecedents Consequence Method XX.  Simple Examples of Antecedents Consequence
        Table VII
        Table VIII XXI.  The Automated Association Methodology
        Table IX - Sample List - Electronic Inventory
        Table X - Sample List - Anti-Cancer Compounds
        Table XI
        Table XII
        Table XIII

UNITED STATES PATENT AND TRADEMARK OFFICE
CERTIFICATE OF CORRECTION

PATENT NO. : 4,414,629

DATED : November 8, 1983

INVENTOR(S) : John H. Waite

It is certified that error appears in the above-identified patent and that said Letters Patent are hereby corrected as shown below:

XXII. Data-Dependent Dynamic Indexing and Commonality Determination
XXIII. Commonality
    Table XIV
XXIV. Positional Distributions
XXV. Classification by Coding
    Table XV
XXVI. Claims Signed and Sealed this Fifteenth Day of January 1985

[SEAL]

Attest:

Attesting Officer

GERALD J. MOSSINGHOFF

Commissioner of Patents and Trademarks